(12) United States Patent
Bosson et al.

(10) Patent No.: US 12,400,160 B2
(45) Date of Patent: Aug. 26, 2025

(54) SYSTEMS AND METHODS FOR SIMULATING AIRCRAFT SYSTEMS

(71) Applicant: Joby Aero, Inc., Santa Cruz, CA (US)

(72) Inventors: Christabelle Simone Juliette Bosson, Mountain View, CA (US); Bogu Wei, Santa Clara, CA (US); Eric Richard Mueller, San Francisco, CA (US)

(73) Assignee: JOBY AERO, INC., Santa Cruz, CA (US)

( * ) Notice: Subject to any disclaimer, the term of this patent is extended or adjusted under 35 U.S.C. 154(b) by 1034 days.

(21) Appl. No.: 17/314,872

(22) Filed: May 7, 2021

(65) Prior Publication Data

US 2021/0350046 A1    Nov. 11, 2021

Related U.S. Application Data

(60) Provisional application No. 63/021,398, filed on May 7, 2020.

(51) Int. Cl.
   *G06F 30/20* (2020.01)
   *G06Q 10/0631* (2023.01)
   *G06Q 50/40* (2024.01)

(52) U.S. Cl.
   CPC ....... *G06Q 10/06313* (2013.01); *G06Q 50/40* (2024.01)

(58) Field of Classification Search
   CPC .................. G06Q 10/06313; G06Q 50/40
   (Continued)

(56) References Cited

U.S. PATENT DOCUMENTS

| | | |
|---|---|---|
| 3,035,789 A | 5/1962 | Young |
| 4,022,405 A | 5/1977 | Peterson |

(Continued)

FOREIGN PATENT DOCUMENTS

| | | |
|---|---|---|
| EP | 0945841 A1 | 9/1999 |
| EP | 2698749 A1 | 2/2014 |

(Continued)

OTHER PUBLICATIONS

Bennaceur et al., "Passenger-centric urban air mobility: Fairness trade-offs and operational efficiency", Transportation Research Part C: Emerging Technologies, 2022, 29 pages.

(Continued)

*Primary Examiner* — Andre Pierre Louis
(74) *Attorney, Agent, or Firm* — DORITY & MANNING, P.A.

(57) ABSTRACT

Systems and methods for simulating aircraft systems are provided. A system includes simulation entity agents defined to represent the behavior of multi-modal ride-sharing agents (e.g., aerial vehicle, ground vehicle, air traffic controllers, etc.) and world data representing a world environment within which the simulation entity agents may operate. The system obtains agent data indicative of a simulation aerial vehicle and world data indicative of a particular simulated world environment. The system determines scenario data including a scenario definition defining a simulation scenario and generates a simulation instance based on the scenario data. The simulation instance includes the simulation aerial vehicle within the simulated world environment. The simulation aerial vehicle can have access, within the simulation, to one or more backend services of a transportation services system configured to facilitate an aerial transportation service. The system can initiate the simulation instance and obtain data while the simulation is running.

20 Claims, 10 Drawing Sheets

(58) Field of Classification Search
USPC .............................................................. 703/8
See application file for complete search history.

(56) References Cited

U.S. PATENT DOCUMENTS

| | | | |
|---|---|---|---|
| 5,823,468 A | 10/1998 | Bothe | |
| 5,839,691 A | 11/1998 | Lariviere | |
| 5,842,667 A | 12/1998 | Jones | |
| 6,343,127 B1 | 1/2002 | Billoud | |
| 6,892,980 B2 | 5/2005 | Kawai | |
| 8,016,226 B1 | 9/2011 | Wood | |
| 8,020,804 B2 | 9/2011 | Yoeli | |
| 8,311,686 B2 | 11/2012 | Herkes et al. | |
| 8,733,690 B2 | 5/2014 | Bevirt et al. | |
| 8,737,634 B2 | 5/2014 | Brown et al. | |
| 8,849,479 B2 | 9/2014 | Walter | |
| 9,205,930 B2 | 12/2015 | Yanagawa | |
| 9,387,928 B1 | 7/2016 | Gentry et al. | |
| 9,415,870 B1 | 8/2016 | Beckman et al. | |
| 9,422,055 B1 | 8/2016 | Beckman et al. | |
| 9,435,661 B2 | 9/2016 | Brenner et al. | |
| 9,442,496 B1 | 9/2016 | Beckman et al. | |
| 9,550,561 B1 | 1/2017 | Beckman et al. | |
| 9,663,237 B2 | 5/2017 | Senkel et al. | |
| 9,694,911 B2 | 7/2017 | Bevirt et al. | |
| 9,771,157 B2 | 9/2017 | Gagne et al. | |
| 9,786,961 B2 | 10/2017 | Dyer et al. | |
| 9,802,702 B1 | 10/2017 | Beckman et al. | |
| 9,816,529 B2 | 11/2017 | Grissom et al. | |
| 9,838,436 B2 | 12/2017 | Michaels | |
| 10,140,873 B2 | 11/2018 | Adler et al. | |
| 10,152,894 B2 | 12/2018 | Adler et al. | |
| 10,216,190 B2 | 2/2019 | Bostick et al. | |
| 10,249,200 B1 | 4/2019 | Grenier et al. | |
| 10,304,344 B2 | 5/2019 | Moravek et al. | |
| 10,330,482 B2 | 6/2019 | Chen et al. | |
| 10,593,215 B2 | 3/2020 | Villa | |
| 10,593,217 B2 | 3/2020 | Shannon | |
| 10,752,365 B2 | 8/2020 | Galzin | |
| 10,759,537 B2 | 9/2020 | Moore et al. | |
| 10,768,201 B2 | 9/2020 | Luo et al. | |
| 10,776,744 B1 * | 9/2020 | Kimchi | G08G 5/0017 |
| 10,832,581 B2 | 11/2020 | Westervelt et al. | |
| 10,836,470 B2 | 11/2020 | Liu et al. | |
| 10,913,528 B1 | 2/2021 | Moore et al. | |
| 10,948,910 B2 | 3/2021 | Taveira et al. | |
| 10,960,785 B2 | 3/2021 | Villanueva et al. | |
| 11,130,566 B2 | 9/2021 | Mikic et al. | |
| 11,145,211 B2 | 10/2021 | Goel et al. | |
| 11,238,745 B2 | 2/2022 | Villa et al. | |
| 11,295,622 B2 | 4/2022 | Goel et al. | |
| 2010/0079342 A1 | 4/2010 | Smith et al. | |
| 2014/0179535 A1 | 6/2014 | Stückl et al. | |
| 2016/0311529 A1 | 10/2016 | Brotherton-Ratcliffe et al. | |
| 2017/0197710 A1 | 7/2017 | Ma | |
| 2017/0357914 A1 | 12/2017 | Tulabandhula et al. | |
| 2018/0018887 A1 | 1/2018 | Sharma et al. | |
| 2018/0053425 A1 | 2/2018 | Adler et al. | |
| 2018/0216988 A1 | 8/2018 | Nance | |
| 2018/0308366 A1 | 10/2018 | Goel et al. | |
| 2018/0354636 A1 | 12/2018 | Darnell et al. | |
| 2019/0146508 A1 | 5/2019 | Dean et al. | |
| 2019/0221127 A1 | 7/2019 | Shannon | |
| 2019/0316849 A1 | 10/2019 | Abrego et al. | |
| 2019/0340937 A1 * | 11/2019 | Villa | G05D 1/46 |
| 2020/0103922 A1 | 4/2020 | Nonami et al. | |
| 2020/0388166 A1 | 12/2020 | Rostamzadeh et al. | |

FOREIGN PATENT DOCUMENTS

| | | |
|---|---|---|
| EP | 3499634 A1 | 6/2019 |
| JP | 2010095246 A | 4/2010 |
| JP | 2013086795 A | 5/2013 |
| WO | WO 2018023556 A1 | 2/2018 |
| WO | WO 2019089677 A1 | 5/2019 |
| WO | WO 2020252024 A1 | 12/2020 |

OTHER PUBLICATIONS

Jong, "Optimizing cost effectiveness and flexibility of air taxis: A case study for optimization of air taxi operations", University of Twente, Master's thesis, 2007, 62 pages.

Miao et al., "Data-driven robust taxi dispatch under demand uncertainties", IEEE Transactions on Control Systems Technology 27, No. 1, 2017, 16 pages.

Miao et al., "Taxi dispatch with real-time sensing data in metropolitan areas: A receding horizon control approach", In Proceedings of the ACM/IEEE Sixth International Conference on Cyber-Physical Systems, 2015, 15 pages.

Uber, "Fast-forwarding to a future of on-demand urban air transportation", 2016, 99 pages.

* cited by examiner

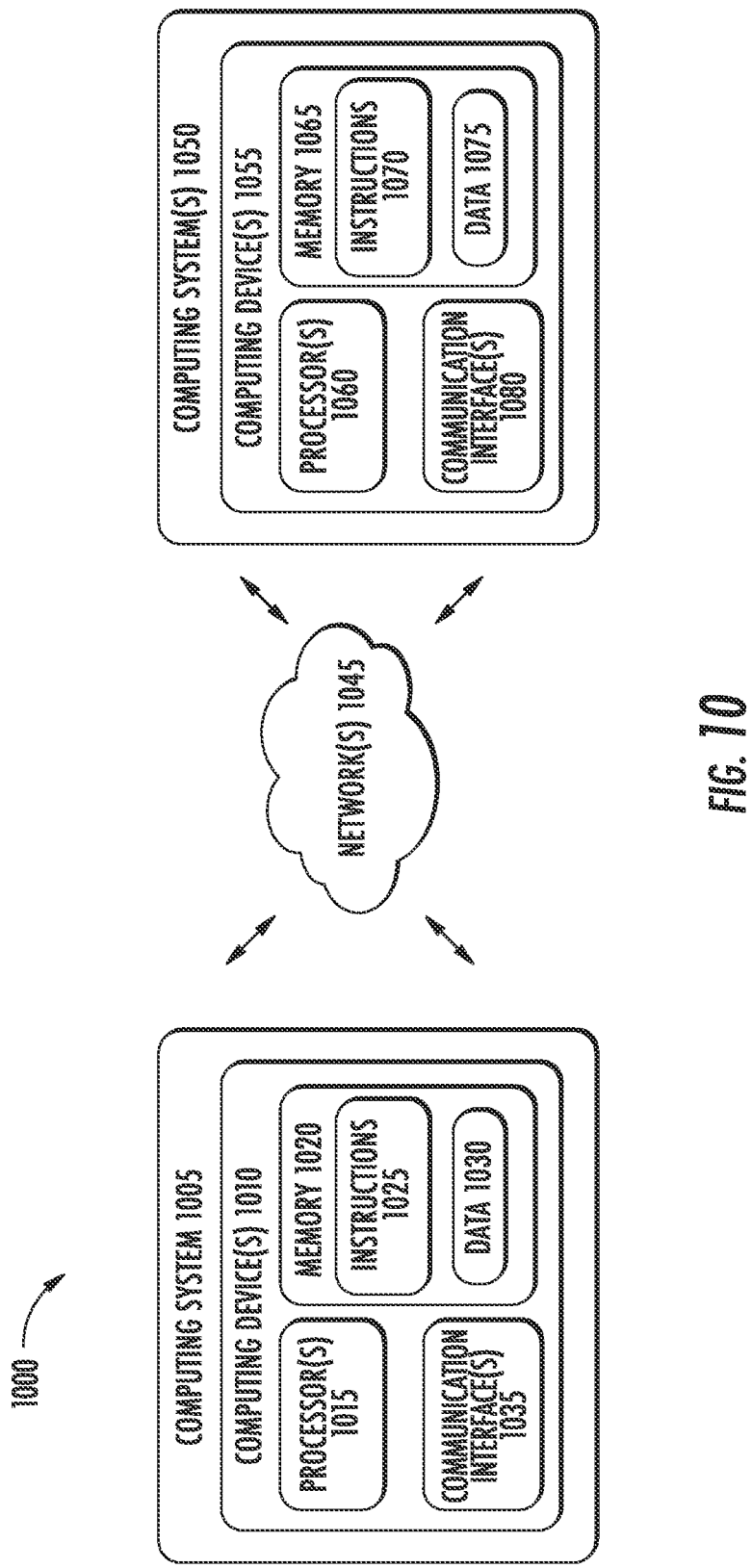

SYSTEMS AND METHODS FOR SIMULATING AIRCRAFT SYSTEMS

PRIORITY CLAIM

The present application claims priority to and benefit of U.S. Provisional Patent Application 63/021,398 having a filing date of May 7, 2020, which is hereby incorporated by reference in its entirety.

FIELD

The present disclosure relates generally to facilitating multi-modal transportation services for riders. More particularly, the present disclosure relates to systems and methods for testing multi-modal transportation services via simulations.

BACKGROUND

A wide variety of modes of transport are available within cities. For example, people can walk, ride a bike, drive a car, take public transit, or use a ride sharing service. As population densities and demand for land increase, however, many cities are experiencing problems with traffic congestion and the associated pollution. Consequently, there is a need to expand the available modes of transport in ways that can reduce the amount of traffic without requiring the use of large amounts of land.

Air travel within cities can reduce travel time over purely ground-based approaches and alleviate problems associated with traffic congestion.

Vertical takeoff and landing (VTOL) aircraft provide opportunities to incorporate aerial transportation into transport networks for cities and metropolitan areas. VTOL aircraft require much less space to take-off and land than other types of aircraft, making them more suitable for densely populated urban environments.

SUMMARY

Aspects and advantages of embodiments of the present disclosure will be set forth in part in the following description, or can be learned from the description, or can be learned through practice of the embodiments.

Aspects of the present disclosure are directed to a system for simulating aircraft systems. The method can include obtaining agent data indicative of a simulation aerial vehicle. The method can include obtaining world data indicative of a simulated world environment. The method can include determining scenario data indicative of a simulation scenario based, at least in part, on the agent data and the world data. And, the method can include generating a simulation instance for the simulation scenario based, at least in part, on the scenario data. The simulation instance can include the simulation aerial vehicle within the simulated world environment and the simulation aerial vehicle can have access to one or more backend services of a transportation services system configured to facilitate an aerial transportation service.

Another aspect of the present disclosure is directed to a system for simulating aircraft systems. The system can include an agent database including agent data indicative of a plurality of simulation agents and a world database including world data indicative of a plurality of simulated world environments. In addition, the system can include one or more processors and one or more memory resources storing instructions that, when executed by the one or more processors, cause the computing system to perform operations. The operations include obtaining, via the agent database, scenario agent data indicative of a simulation aerial vehicle. The simulation aerial vehicle can be one of the plurality of simulation agents. The operations include obtaining, via the world database, scenario world data indicative of a simulated world environment of the plurality of simulated world environments. The operations include determining scenario data indicative of a simulation scenario based, at least in part, on the scenario agent data and the scenario world data. And, the operations include generating a simulation instance for the simulation scenario based, at least in part, on the scenario data. The simulation instance can include the simulation aerial vehicle within the simulated world environment and the simulated aerial vehicle can have access to one or more backend services of a transportation services system configured to facilitate an aerial transportation service.

Another aspect of the present disclosure is directed to another system for simulating aircraft systems. The system can include one or more processors and one or more memory resources storing instructions that, when executed by the one or more processors, cause the system to perform operations. The operations include obtaining agent data indicative of a simulation aerial vehicle. The operations include obtaining world data indicative of a simulated world environment. The operations include determining scenario data indicative of a simulation scenario based, at least in part, on the agent data and the world data. The operations include generating a first simulation instance for the simulation scenario based, at least in part, on the scenario data and a first start time. The simulation instance can include the simulation aerial vehicle within the simulated world environment and the simulated aerial vehicle can have access to one or more backend services of a transportation services system configured to facilitate an aerial transportation service. The operations can include initiating the first simulation instance by running the first simulation instance over one or more time steps beginning at the first start time.

Other aspects of the present disclosure are directed to various systems, apparatuses, non-transitory computer-readable media, user interfaces, and electronic devices. These and other features, aspects, and advantages of various embodiments of the present disclosure will become better understood with reference to the following description and appended claims. The accompanying drawings, which are incorporated in and constitute a part of this specification, illustrate example embodiments of the present disclosure and, together with the description, serve to explain the related principles.

In some cases, the aspects of the present disclosure can utilize autonomous vehicle technology. The autonomous vehicle technology described herein can help improve the safety of passengers of an autonomous vehicle, improve the safety of the surroundings of the autonomous vehicle, improve the experience of the rider and/or operator of the autonomous vehicle, as well as provide other improvements as described herein. Moreover, the autonomous vehicle technology of the present disclosure can help improve the ability of an autonomous vehicle to effectively provide vehicle services to others and support the various members of the community in which the autonomous vehicle is operating, including persons with reduced mobility and/or persons that are underserved by other transportation options. Additionally, autonomous vehicles of the present disclosure may reduce traffic congestion in communities as well as provide alternate forms of transportation that may provide environmental benefits.

BRIEF DESCRIPTION OF THE DRAWINGS

Detailed discussion of embodiments directed to one of ordinary skill in the art is set forth in the specification, which makes reference to the appended figures, in which:

FIG. 10 depicts a block diagram of an example computing system according to example embodiments of the present disclosure.

DETAILED DESCRIPTION

Figure 1:
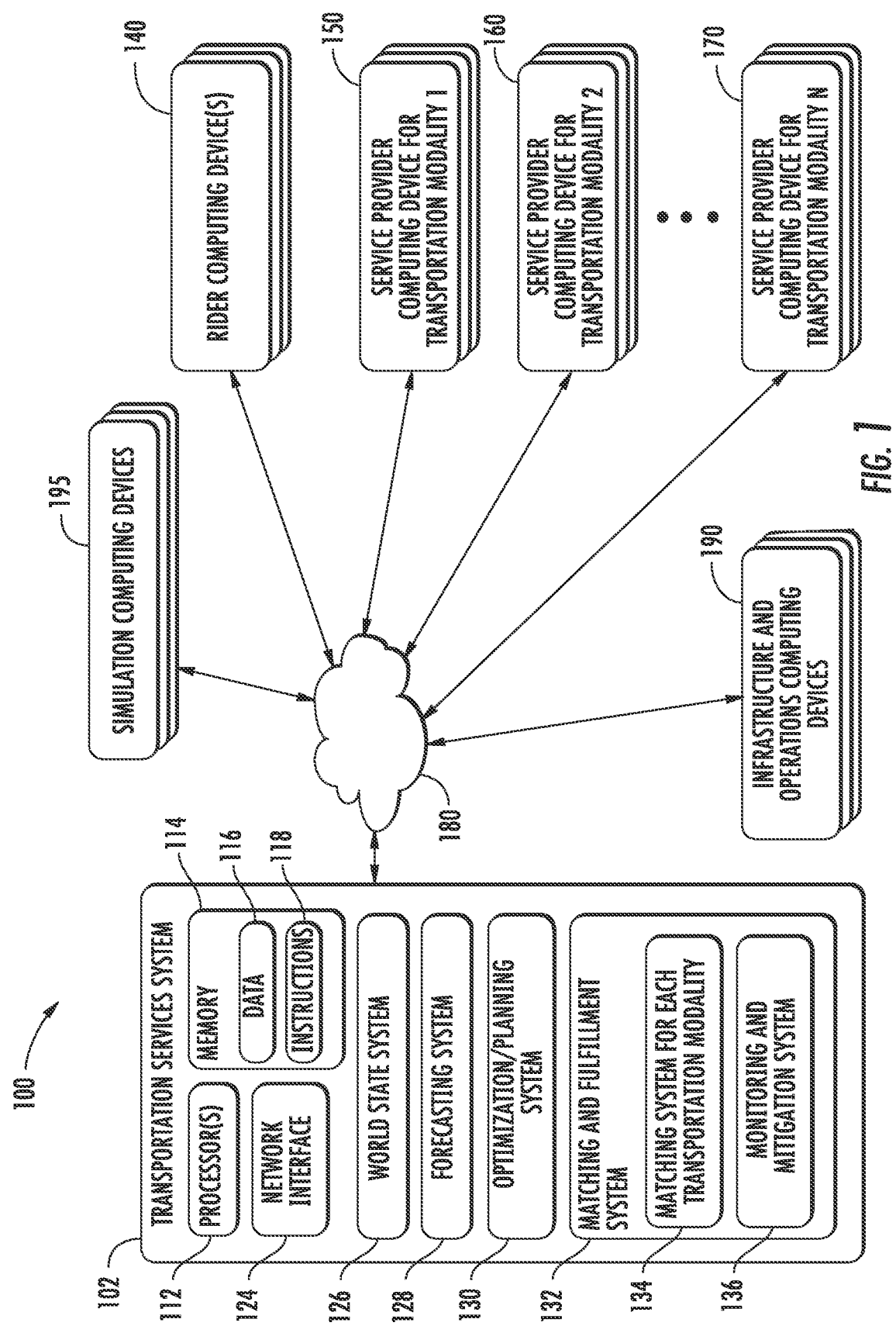
FIG. 1 depicts a block diagram of an example computing system according to example embodiments of the present disclosure.

Aspects of the present disclosure are directed to improved systems and methods for multi-modal transportation service systems. In particular, aspects of the present disclosure are directed to the simulation of multi-modal transportation systems. For instance, a service entity can manage and coordinate a plurality of different types of vehicles to provide services to a plurality of users via a transportation platform. By way of example, a user may generate a service request for transportation from an origin location to a destination location via an application running on the user's device. An operations computing system associated with the service entity (e.g., a cloud-based transportation services system, etc.) can obtain data indicative of the service request and generate one or more itineraries (e.g., user itinerary, flight itinerary, etc.) to facilitate transporting the user from the origin location to the destination location. A user itinerary, for example, can be a multi-modal transportation itinerary that includes at least two types of transportation such as, for example, a ground-based vehicle transportation and an aerial transportation. For example, the itinerary can include three legs: a first leg that includes a ground-based vehicle transporting a user from the origin location (e.g., a home, etc.) to a first aerial transport facility; a second leg (e.g., an aerial portion) that includes an aircraft transporting the user from the first aerial transport facility to a second aerial transport facility; and a third leg that includes another ground-based vehicle transporting the user from the second aerial transport facility to the destination location (e.g., a conference center).

The service entity can also have an infrastructure that can allow the service entity to assign a transportation service assignment to and interact with vehicle(s) (e.g., aerial vehicles, ground vehicles, etc.) managed by a number of different transportation service provider(s) (e.g., "a third-party service providers"). Such an infrastructure can include a platform comprising one or more application programming interfaces (APIs) that are configured to allow vehicle(s) and other transportation entities (e.g., air traffic controllers, vehicle operators (e.g., pilots, drivers, etc.), aerial transport facilities, etc.) to communicate and/or use one or more services of the service entity (e.g., backend services of a transportation services system, etc.). For example, the vehicle(s) and other transportation entities can utilize one or more backend services (e.g., world state systems, forecasting systems, optimization/planning systems, routing systems, assistance systems, etc.) of the service entity to aid in the determination and fulfillment of a transportation service in real time. For instance, the application programming interface (API) platform can have one or more functional calls defined to be accessed by vehicle(s) and other transportation entities. The vehicle(s) and other transportation entities can be configured to access one or more of the functional calls during the fulfillment of a transportation service. For example, a third-party aircraft can access a functional call to a forecasting system of the service entity to obtain a weather forecast for a portion of a transportation service, reassignment based on one or more contingencies with the transportation service, etc.

To help develop the transportation service system as well as improve vehicle-platform integration (e.g., aerial vehicle integration), a computing system can generate and initiate a number of simulation instances for one or more transportation scenarios. Each transportation scenario can include a number of simulation agents (e.g., simulated pilots, aircraft, air traffic controllers, weather, etc.) within a simulated world environment. The simulation agents can include a simulated aerial vehicle agent with behaviors representing those of a real world vehicle (e.g., a third party aircraft, a service entity aircraft, etc.). In this respect, the simulation aerial vehicle can have access to the one or more services of the transportation services system during the simulation. For instance, a simulation instance can enable a simulated third-party aircraft to access a function call to a routing system of the service entity to obtain a transportation route for a portion of a simulated transportation service as if the simulated third-party aircraft was operating in a real-time environment. A computing system can track and evaluate aircraft performance to help recommend and/or make adjustment for improving aircraft performance within the transportation environment.

In this manner, the computing system of the present disclosure provides improved techniques for testing one or more components of a transportation services system. For instance, the computing system can help ensure that a number of different vehicles (e.g., of the service entity's fleet, of a third-party fleet, etc.) are able to properly receive and complete service assignments (e.g., transporting a user from one location to another) as well as communicate with the infrastructure endpoints (e.g., backend services). To do so, the computing system can utilize a number of different simulation agents, each associated with behaviors based on a different vehicle. In this way, the systems and methods of the present disclosure can safely and efficiently test the efficacy of a transportation services system (and/or one or more backend services thereof) under a number of different scenarios defined by a number of simulation agents. Moreover, a number of different simulation instances based on various real world scenarios can be run concurrently and/or in parallel. This, in turn, allows the computing system to realistically evaluate and optimize a transportation services system through a number of robust simulations occurring simultaneously.

More particularly, a transportation services system can receive a request from a user to facilitate a transportation service for the user from an origin to a destination. For example, the user can interact with a dedicated application on the user's computing device (e.g., smartphone, tablet, wearable computing device, or the like) to initiate the request. In response to the request, the transportation services system can generate at least one itinerary that includes transportation of the user from the origin to the destination. Specifically, the transportation services system can create an end-to-end multi-modal itinerary that includes two or more transportation legs that include travel via two or more different transportation modalities such as, for example: cars, light electric vehicles (e.g., electric bicycles or scooters), buses, trains, aircraft, watercraft, and/or other transportation modalities. Example aircrafts can include helicopters and other vertical take-off and landing aircraft (VTOL) such as electric vertical take-off and landing aircraft (eVTOL).

The vehicles can include non-autonomous, semi-autonomous, and/or fully-autonomous vehicles provided and/or maintained by one or more service providers. For instance, each vehicle can include a service entity vehicle provided and/or maintained by a service entity service provider associated with the transportation services system and/or a third party vehicle provided and/or maintained by a third party service provider. As described herein, the transportation services system can provide cross-platform support to third party service providers. For instance, the transportation services system can provide access to one or more services of the transportation services system to systems (e.g., third-party vehicle computing systems, third-party air traffic control systems, etc.) associated with third party service providers.

An autonomous vehicle can include various systems to allow the vehicle to operate autonomously (e.g., with little or no input from an operator). For example, an autonomous vehicle can include a routing system, a positioning system, a motion planning system, and one or more vehicle control systems. The routing system can generate (onboard the vehicle) and/or obtain (from a remote computing device) a route for the vehicle to follow from one location to one or more other locations. The positioning system can determine a current position of the vehicle. The positioning system can be any device or circuitry for analyzing the position of the vehicle. For example, the positioning system can determine position by using one or more of inertial sensors, a global positioning system/satellite positioning system, based on IP/MAC address, by using triangulation and/or proximity to network access points or other network components (e.g., cellular towers and/or Wi-Fi access points) and/or other suitable techniques. The position of the vehicle can be used by various systems of the vehicle computing system and/or provided to one or more remote computing devices (e.g., cloud services system).

The vehicle can identify its position within its environment and/or along a route. The vehicle can obtain map data that can provide the vehicle relative positions of the surrounding environment of the vehicle (e.g., buildings, aerial facilities, landing areas, etc.). The vehicle can obtain route data indicative of a route to be followed (e.g., to travel from one aerial facility to another). The vehicle can identify its position within the surrounding environment based at least in part on the data described herein to help follow along the route. For example, the vehicle can process sensor data (e.g., LIDAR data, camera data, positioning data, etc.) from sensors onboard the vehicle to match it to a map of the surrounding environment and/or a route to get an understanding of the vehicle's position within that environment and/or along the route (e.g., transpose the vehicle's position within its surrounding environment/route).

In some implementations, an autonomous vehicle (e.g., aircraft) can include a perception system and/or a prediction system, and/or other systems that cooperate to perceive and predict the states of the surrounding environment of the vehicle. For instance, the vehicle can obtain sensor data from one or more onboard sensors. The vehicle can detect object(s) (e.g., other aircraft, etc.) within its environment via the perception system and determine the state of the detected object(s) (e.g., type, shape, size, position, velocity, speed, heading, etc.) at one or more times by processing the sensor data (e.g., utilizing machine-learned models, heuristics, etc.).

The vehicle can predict the motion of those object(s) via the prediction system. For example, the vehicle can utilize the state of a detected object at one or more past/current times to predict a motion plan of an object at one or more future times. The predicted path (e.g., trajectory, waypoints, etc.) can indicate a path along which the respective object is predicted to travel over time (and/or the velocity at which the object is predicted to travel along the predicted path).

The autonomous vehicle can utilize its motion planning system to plan the vehicle's motion. For example, the motion planning system can generate vehicle trajectories for the vehicle to follow along a route. The vehicle trajectories can be a certain short term length (e.g., 10 ft, 50 ft., 100 ft., 500 ft., etc.) and can be determined at a particular short term frequency (e.g., 1 second or less, etc.) and/or can be a certain long term length (e.g., 10 km, 50 km, 100 km, 500 km, etc.) that can be determined at a particular long term frequency (e.g., 1 hours or less, etc.). In some implementations, the motion planning system can determine the vehicle trajectories based at least in part on the state data (determined by the perception system) and/or the predicted object motion (determined by the perception system). This can allow the vehicle to avoid interference with any object(s) within its surroundings. The motion planning system can generate a plurality of candidate vehicle trajectories at a time and select a vehicle trajectory for execution (e.g., based on cost functions, reward functions, penalties, etc.). For example, the motion planning system can select a vehicle trajectory that avoids interfering with the object(s) within the vehicle's surroundings (e.g., with a buffer distance) while also minimizing deviation from the vehicle's route and/or skylane. In some implementations, the motion planning system can stitch together a plurality of trajectories to plan the motion of vehicle over longer distances. The selected trajectory(s) can be provided to the vehicle control systems (e.g., associated with a throttle interface, steering interface, etc.) for execution to adjust the vehicle's speed, position (e.g., altitude, longitudinal position, latitudinal position, etc.), orientation (e.g., yaw, pitch, roll, etc.), and/or other motion parameters. In some implementations, the selected trajectory can be translated into instructions that can be implemented by these control system(s). In this way, a vehicle (e.g., aircraft) described herein can autonomously navigate/travel from one location to another (e.g., while traversing an assigned route).

In response to a user's request, the transportation services system can perform one or more algorithms to generate an itinerary for the user. As an example, the transportation services system can sequentially analyze and identify potential transportation legs for each different available transportation modality. For example, a most critical, challenging, and/or supply-constrained transportation leg can be identified first and then the remainder of the itinerary can be stitched around such leg. In some implementations, the order of analysis for the different modalities can be a function of a total distance associated with the transportation service (e.g., shorter transportation services result in ground-based modalities being assessed first while longer transportation services result in flight-based modalities being assessed first).

As one particular example, in some implementations, the transportation services system can initially analyze a first transportation modality that is the most efficient (e.g., in terms of travel speed and/or cost) transportation modality which operates according to a fixed infrastructure. As an example, for most longer transportation services and for the mix of different modalities described above, flight modalities will often both be the most efficient transportation modality (e.g., in terms travel speed/time) while also operating according to a fixed infrastructure. By first analyzing the most efficient transportation modality which operates according to a fixed infrastructure, the transportation services system can seek to identify an important transportation leg around which the remainder of the itinerary can be stitched.

More particularly, in some implementations, one or more of the transportation modalities can operate according to or within a fixed transportation infrastructure in which the ability of passengers to embark and disembark vehicles is constrained to a defined set of transportation nodes. For instance, the fixed transportation infrastructure can include a plurality of aerial vehicles (e.g., service entity aircraft, third-party aircraft, etc.) that operate within a ride sharing network facilitated by the transportation services system. The aerial vehicle(s) can be constrained to load and unload passengers only at a defined set of physical take-off and/or landing areas which may in some instances be referred to as aerial transport facilities. To provide an example, a large urban area may have dozens of aerial transport facilities located at various locations within the urban area. Each aerial transport facility can include one or more landing pads and/or other infrastructure to enable passengers to safely embark or disembark from aerial vehicles. Aerial transport facilities can also include charging equipment, cooling equipment, re-fueling equipment, and/or other infrastructure for enabling aircraft operation. The take-off and/or landing areas of the aerial transport facilities can be located at ground level and/or elevated from ground-level (e.g., atop a building).

The use of fixed infrastructure can constrain the number and availability of service providers. As such, in some instances, the transportation services system can initially identify any aerial transport facilities associated with a first transportation modality (e.g., flight modality) that are relevant to the user's request. For example, the transportation services system can identify any aerial transport facilities that are within a threshold distance from the origin location as candidate departure facilities. Likewise, the transportation services system can identify any aerial transport facilities that are within a threshold distance from the destination location as candidate arrival facilities.

The transportation services system can pre-determine a number of planned transportation services by the service providers. For example, in some implementations, aerial vehicles of a ride-sharing network (e.g., service entity vehicles, third-party vehicles, etc.) can be scheduled and/or otherwise controlled by the transportation services system in accordance with the ride sharing network. For instance, the transportation services system can generate (e.g., on a daily basis) an initial pre-defined set of flight plans for the aerial vehicles of the ride-sharing network and can add and/or remove passengers from each planned flight. In some implementations, the transportation services system can dynamically optimize (e.g., via an optimization and planning system) planned transportation services by the service providers to account for real-time changes in rider availability and demand. For example, the computing system can dynamically modify the pre-determined flight plans (e.g., delay a planned flight departure by five minutes and/or change a planned flight to an alternative arrival transportation node).

In scenarios in which the first transportation modality operates according to pre-determined plans, after identifying the relevant aerial transport facilities, the transportation services system can access a database of pre-determined transportation plans to identify candidate transportation plans between the relevant facilities. For example, the transportation services system can identify any transportation plans between one of the candidate departure facilities and/or one of the candidate arrival facilities which would satisfy the user's request, including, for example, any departure or arrival time requests.

In some implementations, for example in which a transportation modality does not have pre-determined plans but instead operates in an "on-demand" nature, the transportation services system can match (e.g., via a matching and fulfillment system, etc.) the user with a service provider for the transportation modality from a free-floating, dynamic pool of independent transportation service providers. For example, service providers can dynamically opt in and out of the ride sharing network and the transportation services system can operate to match the passenger with a service provider who is currently opted into the network. The service provider can choose to provide the service to the passenger or decline to provide the service. For example, for flight modalities, the transportation services system can match the user to one of a dynamically changing pool of aerial vehicles and the aerial vehicles (e.g., a pilot of an aerial vehicle, a service provider associated with the aerial vehicle, etc.) can choose (e.g., via one or more functional calls a matching and fulfillment system) to provide or decline the proposed aerial transport service.

The transportation services system can identify a set of candidate transportation plans that can form the basis for building a set of potential itineraries. The transportation services system can stitch additional transportation legs to each respective candidate transportation plan to generate a plurality of candidate end-to-end itineraries. The transportation services system can analyze the candidate itineraries to select one or more itineraries that are high quality according to various measures. The transportation services system can interact with one or more vehicles (e.g., aerial vehicles, ground vehicles, etc.) and/or one or more service providers of the one or more vehicles to enable the user to complete at least one of the one or more itineraries. The service providers, for example, can include a service entity service provider associated with the transportation services system and/or one or more third-party service providers. In some implementations, the one or more vehicles can include a human operator (e.g., driver or pilot) and/or a vehicle computing system.

The transportation services system can continuously monitor (e.g., via a monitoring and mitigation system, etc.) the success/viability of each transportation leg in an itinerary and can perform real-time mitigation when a particular transportation leg becomes significantly delayed, cancelled, and/or unfulfilled. For example, the transportation services system can include a monitoring and mitigation subsystem configured to provide one or more mitigation services for a transportation service. The monitoring and mitigation system can continuously generate contingency itineraries for a transportation service. For example, the contingency itineraries can be generated using a process as described above but taking into account potential or actual delays in certain transportation legs. When it is detected that mitigation interventions should be performed, the monitoring and mitigation system can automatically select the best available contingency itineraries and push the selected itineraries out to a respective vehicle, service provider, and/or any other transportation entity. In some instances, this dynamic contingency generation can include a continuous system-wide re-optimization of itineraries based on real-time conditions.

The transportation services system can include a number of additional subsystems configured to provide a plurality of backend services to facilitate a transportation service. By way of example, an optimization/planning system can provide a backend an itinerary service to generate one or more itineraries for a user in accordance with the procedures described herein. In addition, the optimization/planning system can provide a backend routing service to determine one or more flight plans, routes, skylanes, etc. for vehicles associated with transportation service. Moreover, the transportation services system can include a world state system, a forecasting system, and/or any other system capable of facilitating a transportation service. As one example, a world state system can operate a state monitoring system to maintain data descriptive of a current state of the world (e.g., a predicted transportation demand, flight assignments, operational statuses and locations of a plurality of vehicles, etc.). For instance, the world state system can be configured to obtain world state data through communication (e.g., via an API platform) with one or more vehicles, service providers, and/or any other transportation entity associated with the transportation services system. As another example, a forecasting system can operate a forecasting service to generate predictions of transportation demand, weather forecasts, and/or any other future looking data helpful for completing a transportation service.

The transportation services system can interact with various service providers (e.g., third-party service providers, service entity service providers, etc.). To do so, the transportation service system can include an application programming interface platform to facilitate services between the service entity infrastructure (e.g., the services of the transportation services system, service entity service providers, etc.) and third party service providers. The API platform can include one or more functional calls to the backend services of the transportation services system. By way of example, the one or more functional calls can be configured to communicate a request and/or data between one or more subsystems (e.g., world state system, forecasting system, optimization/planning system, etc.) of the transportation services system and one or more transportation entities associated with a transportation service (e.g., aerial vehicle, air traffic controllers, ground vehicle, pilots, passengers, etc.).

The one or more functional calls can be defined to be accessed by the service entity (e.g., vehicles and/or other transportation entities of the service entity), one or more third party service providers (e.g., vehicles and/or other transportation entities of the third party service providers, etc.), etc. In this manner, the API platform can facilitate access to back-end services (e.g., provided by backend systems of the service entity (e.g., transportation services system)) to aerial vehicles associated with one or more different service providers. By way of example, the API platform can provide access to services provided by the transportation services system such as world state services, a forecasting services, an optimization/planning services, and/or any other service provided by the transportation services system.

According to aspects of the present disclosure, a simulation computing system can test the services provided by the transportation services system by simulating a plurality of real-time ride sharing scenarios with a plurality of different aerial vehicles and/or other transportation entities (e.g., air traffic controllers, aerial transport facilities, etc.) associated with providing a transportation service. To do so, the simulation computing system can generate a simulation instance based on a simulation scenario identifying a plurality of simulation agents and a simulated environment in which the simulation agents may interact. The simulation agents, for example, can include one or more agents configured to represent real life counterparts such as, for example, service entity vehicles, third-party vehicles, air traffic controller systems, passengers, pilots, ground vehicles, aerial transport facility systems, etc. As described herein, the one or more agents can have access to one or more backend services of the transportation services system during a simulation such that one or more of the backend services of transportation services system can be utilized within the simulated environment.

The simulation computing system can have access to one or more simulation databases such as, for example, an agent database, a world database, an evaluation database, etc. As one example, an agent database can include agent data indicative of a plurality of simulation agents. As another example, a world database can include world data indicative of a plurality of simulated world environments. And, an evaluation database, for example, can include evaluation data for evaluating one or more aspects of the transportation services system.

Each of the plurality of simulated world environments of the world data can include a simulated environment representing a real world environment over a period of time (e.g., one or more minutes, hours, days, etc.). For example, a simulated world environment can include a plurality of environment variables (e.g., wind speed, humidity, temperature, cloud coverage, etc.) and/or airspace rules (e.g., altitude constraints, speed constraints, temporary flight restrictions, etc.) for each of a plurality of locations (e.g., simulated geographic coordinates, altitudes, etc.) and each of a plurality of time steps (e.g., seconds, minutes, etc.) associated with the simulated world environment. An environment variable, for example, can include a wind speed across one or more simulated geographic coordinates at one or more simulated altitudes during one or more seconds within a simulated environment. By way of example, the wind speed can be dynamic, being a function of time, position, and altitude, and thus the wind speed can be represented by a three-dimensional vector indicating a direction, speed, etc. As another example, an airspace rule can include a temporary flight restriction for one or more simulated geographic coordinates at one or more simulated altitudes during one or more minutes within a simulated environment.

The world data indicative of a respective simulated world environment can include prerecorded real world data. For example, a respective simulated world environment can include a representation of real world conditions over a recorded time period. By way of example, a simulated world environment can represent a plurality of environmental conditions and/or airspace rules in effect between one or more aerial transport facilities of a service entity infrastructure. For instance, the world data for the respective simulated world environment can be prerecorded by one or more aerial vehicles (e.g., service entity aerial vehicles, third party vehicles, etc.) and/or other devices (e.g., weather sensors, noise sensors, etc.) during the performance of one or more transportation services. In addition, or alternatively, the world data can include other recorded information for the area covered by the respective simulated world environment such as, for example, weather reports from weather stations, air traffic restrictions from air traffic controllers, and/or any other information relevant for providing a transportation service. As discussed herein, a simulated world environment can provide data in which a plurality of simulated agents can interact to create simulation instance.

For example, the agent database can include agent data for each of a plurality of simulation agents. Each simulation agent of the plurality of simulation agents can include an agent definition that captures agent behavior expected at every simulation iteration over time (e.g., as defined by a simulation time discussed herein). For instance, a simulation agent can include a simulation entity agent that models the behavior of a real life entity counterpart. By way of example, a simulation entity agent can include an aerial vehicle agent (e.g., service entity aerial vehicle agent, third-party aerial vehicle agent, etc.), an air traffic controller agent, a passenger agent, a pilot agent, a ground vehicle agent, an aerial facility agent, and/or an agent for any other entity associated with a transportation service. Each respective simulation agent can be defined by an agent definition that models the simulation agent's behavior within a simulated environment.

By way of example, an agent definition can include an activation behavior, a termination behavior, one or more agent attributes, and/or agent interface data defining one or more agent interfaces. The activation behavior, for example, can define one or more characteristics for an agent upon initialization. By way of example, an activation behavior for an aerial vehicle agent can include a location within the simulated world environment (e.g., an aerial facility represented by the simulated world environment, a location within a route being traversed by the aerial vehicle, etc.), a scheduled transportation service, an initial state (e.g., initial speed, progress of a transportation service), and/or any other information relevant to providing a transportation service. The activation behavior, when triggered, can result in the complete execution of the agent definition at every simulation iteration over time.

The termination behavior can define one or more characteristics for an agent that trigger its destruction within a simulation instance. By way of example, the termination behavior can be indicative of a location within the simulation (e.g., a simulated aerial facility that, once reached by an aerial vehicle, signifies the completion of a transportation service, etc.), a time period (e.g., a duration of simulated time within a simulation instance, etc.), and/or any behavior associated with a transportation service. The activation and/or the termination behavior can be predetermined (e.g., a default activation/termination behavior included in the agent definition) and/or dynamically determined for each simulation scenario (e.g., defined by input data to the simulation computing system, etc.).

The one or more agent attributes can include one or more simulated natural, measured, and/or communicated instance values indicative the simulated world environment relative to a respective simulation agent. The instance values, for example, can include an agent location within the simulated world environment at any given time step of the simulation instance, a wind speed at the agent location (e.g., for a vehicle agent preparing to take off, progressing through a simulated vehicle route, etc.), an agent speed (e.g., a wind speed for a weather agent, a vehicle speed for an aerial/ground vehicle agent, etc.), and/or any other value relevant to a respective agent and/or a transportation service.

In some implementations, the agent attribute(s) can include multiple values for each agent attribute. For example, a simulation agent can distinguish intent between various values that conceptually represent the same agent attribute. By way of example, a simulation agent can include multiple notions of its own position at any given time within the simulation instance. Its position can include, for example, its true position (e.g., as indicated by the simulated world environment), its sensed position (e.g., the position obtained by a sensor interface simulating sensors of the simulation agent), a predicted position (e.g., a position predicted by a behavioral engine of the simulation agent), and/or a communicated position (e.g., a position communicated by the simulation agent). In this respect, agent attribute(s) can include simulated instance values (e.g., a true position) modeling a corresponding attribute of the real entity represented by the agent and simulation instance values (e.g., a sensed position, communicated position, etc.) determined by the simulation agent during a simulation instance.

Each instance value can be classified as natural, measured, and/or communicated. A natural instance value can represent the actual state (e.g., true position) of a respective agent within the simulated world environment. The measured instance value can represent the natural instance value as interpreted by a simulated measurement device (e.g., a simulated global positioning system, etc.). The communicated instance value can represent a measure instance value that is made know to another agent and/or services associated with the simulation instance (e.g., backend services of the transportation services system). In addition, or alternatively, the instance values can include engine internal instance values that can aid in the execution of an agent's behavioral engine.

By way of example, the interface data for the one or more agent interfaces can define a sensor interface configured to determine one or more measured values, a communications interface configured to communicate (e.g., receive, transmit, etc.) data (e.g., measured value(s), etc.) within a simulated world environment, a behavioral engine defining one or more dynamic behaviors of a respective simulation agent, and/or any other interfaces defining how a respective simulation agent interacts within a simulated world environment. The sensor interface, for example, can be configured to determine one or more measured values based, at least in part, on at least one of the plurality of environment variables of a simulated world environment. The sensor interface can model the actual measurement of real-world data. The communications interface can be configured to communicate one or more simulated messages (e.g., indicative of the one or more measured values) with one or more secondary simulation agents and/or services associated with a simulation instance. The communications interface can model the actual transmission of real-world data.

The behavioral engine can be configured to characterize the performance and dynamic behaviors of a respective simulation agent. By way of example, the one or more dynamic behaviors of a simulated aerial vehicle can be defined based, at least in part, on a predicted behavior for an aerial vehicle corresponding to the simulated aerial vehicle. The predicted behaviors can be determined by the behavioral engine based on one more agent dynamics models configured to predict the behavior of a respective simulation agent. By way of example, a simulation aerial vehicle agent can include a behavioral engine with one or more aerial dynamics models configured to predict the trajectory of the simulation aerial vehicle agent based on one or more conditions a simulated environment.

The behavioral engine can include one or more functional calls to one or more services of the transportation services system. As an example, a behavioral engine for a simulation aerial vehicle can include one or more functional calls to a routing service of the transportation services system to obtain a route for a simulated transportation service. In some implementations, the predicted trajectory for the simulated aerial vehicle agent can be determined by the behavioral engine based on an interaction with one or more services of the transportation services system (e.g., the predicted trajectory can carry out a route received from the transportation services system).

In addition to the agent attribute(s), the activation behavior, and the termination behavior, an agent definition can be associated with an agent type indicative of the configuration of each of the one or more agent interfaces. Thus, one example agent definition defining an aerial vehicle agent can include an agent type (e.g., electric vertical take-off and landing type, a drone type, helicopter type, etc.), a service entity affiliation attribute (e.g., service entity aerial vehicle, third-party service provider aerial vehicle, etc.), a unique identifier (e.g., a tail number), an assigned flight number attribute (e.g., indicative of a transportation service assigned to the aerial vehicle agent), an origin location attribute, a destination location attribute, a route attribute, a predicted trajectory attribute, a contingency plan attribute, a current flight phase attribute, a current time stamped position attribute, a subsequent flight phase attribute, a subsequent time stamped position attribute, a subsequent waypoint attribute, a future predicted trajectory attribute, and/or any other information relevant for an aerial vehicle to complete a transportation service.

A simulation entity agent can include a simulation representing the behavior and attributes of a corresponding real-life entity. As specific examples, an aerial vehicle agent can include a service entity aerial vehicle agent representing the behavior and attributes of a service entity aerial vehicle (e.g., an aerial vehicle owned, leased, and/or controlled by the service entity), a third party aerial vehicle agent representing the behavior and attributes of a third party aerial vehicle (e.g., an aerial vehicle owned, leased, and/or controlled by the service entity), and/or a hybrid aerial vehicle representing the behavior and attributes of an aerial vehicle currently running outside of a simulation instance.

More specifically, a service entity aerial vehicle agent can simulate the behavior of a real service entity aerial vehicle flying a route in an airspace while interacting with one or more backend services of the transportation services system and/or one or more other agents within a simulation instance. For instance, the service entity aerial vehicle agent can be defined by a behavioral engine modeling the behavior of a real world service entity aerial vehicle. For example, the behavioral engine can have access to a trajectory prediction service (e.g., one or more predictive models) that computes a trajectory for the simulation service entity vehicle as if the service entity aerial vehicle agent is operating in the real world. The behavioral engine can utilize one or more advanced aircraft dynamics using sensor models (e.g., one or more machine-learned models). The sensor models can alter a predicted trajectory for the service entity aerial vehicle agent based on a condition present by the simulated world environment.

The behavioral engine can be described by one or more rules of behavior. The rules of behavior can include computing the current state vector and position of the simulation service entity aerial vehicle, computing the future trajectory from the current position, computing and/or updating an estimated time of arrival along a route, and/or determining and updating its flight phase during the trip. In some implementations, the rules of behavior can include one or more interactions with the transportation services system.

For example, a simulation service entity aerial vehicle can receive a transportation service assignment from the transportation services system. In such a case, the rules of behavior can include providing the estimated time of arrival to the transportation services system, requesting a route to complete the transportation service assignment, requesting a contingency route, requesting route information and/or any other interaction to facilitate the service assignment. The rules of behavior can include a functional call to the transportation services system to provide the estimated time of arrival. The functional call can be called by the service entity aerial vehicle agent as if the service entity aerial vehicle agent is a real service entity aerial vehicle. By way of example, the service entity aerial vehicle agent can make the functional call using preexisting software used and/or to be used (e.g., in a testing phase) by a real service entity aerial vehicle. In this manner, an issue with a functional call to a service by the service entity aerial vehicle agent and/or an issue with the implementation of the called service can identify a potential issue with the transportation services system and/or the real service entity aerial vehicle corresponding to the service entity aerial vehicle agent.

A third party aerial vehicle agent can simulate the behavior of a real third party aerial vehicle flying a route in an airspace while interacting with one or more backend services of the transportation services system and/or one or more other agents within a simulation instance. For instance, the third party aerial vehicle agent can be defined by a behavioral engine modeling the behavior of a real world third party aerial vehicle in the same manner discussed above with reference to the service entity aerial vehicle agent. The rules of behavior can include a functional call to the transportation services system as if the third party aerial vehicle agent is a real third party aerial vehicle. In this way, the simulated third party aerial vehicle can make the functional call using preexisting software used and/or to be used (e.g., in a testing phase) by a real third party aerial vehicle. In this manner, an issue with a functional call to a service by the third party aerial vehicle agent and/or an issue with the implementation of the called service can identify a potential issue with the transportation services system and/or the real third party aerial vehicle corresponding to the third party aerial vehicle agent.

A behavioral engine can be defined for each of the simulation entity agents in a similar manner. For example, a behavioral engine can be defined for a simulated autonomous airspace agent. The rules of behavior of the behavioral engine can include functional calls to the transportation services system such as, for example, functional call to build a departure queue, build an arrival queue, call one or more services to obtain a route selection, operation creation, scheduler, sequencing, and/or any other functions provided by the transportation services system. Additional behavioral engines can be defined for simulation passenger agents, pilot agents, ground vehicle agents, facility agents, communications agents, surveillance agents, etc.

In some implementations, the simulation agent can include a hybrid aerial vehicle agent. A hybrid aerial vehicle agent can simulate the behavior of a real aerial vehicle currently flying a route in an airspace while interacting with one or more backend services of the transportation services system and/or one or more other agents within a simulation instance. For example, a hybrid aerial vehicle agent can derive one or more attributes from an external source (e.g., a real aerial vehicle) and simulate the derived attributes within a simulation instance. In this manner, the simulation computing system can generate hybrid simulation instances with one or more predetermined simulation agents from the agent database and/or one or more dynamically determined simulation agents (hybrid aerial vehicle agents) modeling the behaviors of currently active real world vehicles.

In addition, the simulation agents can include one or more world agent(s) (e.g., a weather agent, etc.) configured to model the behavior of one or more aspects of the simulated world environment. The world agent(s), for example, can represent a world condition (e.g., wind, flight restrictions, etc., as indicated by a simulated world environment). World agents can interact with the simulated world environment and a world state (e.g., a simulated world environment at a particular time step) to act as mediums between simulation agents and/or the simulated world environment. For instance, a world agent can include a simulation moderation agent that can model the interaction between aerial vehicle agents, the simulated world environment, and/or one or more services of the transportation services entity. As an example, the moderation agent can monitor data indicative of a current simulated world state (e.g., variables of a simulated world environment at a particular time step). The moderation agent can accept a functional call (e.g., a weather forecast request) to a service (e.g., offered by a forecasting system) of the transportation services system from a simulation agent and forward (e.g., based on integration data described below) the functional call with data indicative of the current simulated world state to the service of the transportation services system. The service can return data (e.g., a forecast) based on the data indicative of the current simulated world state to the moderation agent which can forward the returned data to the simulation agent.

In addition, or alternatively, a world agent can include a weather agent modeling the weather of a simulated world environment. The weather agent can include a plurality of environment agents for each weather condition (e.g., rain agent, wind agent, humidity agent, temperature agent, etc.). Each environment agent can model a condition of the simulated world environment as indicated by one or more environment variables of the simulated world environment. By way of example, a respective humidity agent can represent the humidity of a pre-recorded environment during a recording time period, a respective wind agent can represent a wind direction and/or velocity of a pre-recorded environment during a recording time period, etc. The weather agent (e.g., one or more environment agents) can interact with one or more other agents (e.g., vehicle agents, etc.) of a simulation instance to provide weather information (e.g., as indicated by the one or more environment variables) to the one or more other agents. In this manner, the simulation computing system can generate a simulation instance with a plurality of interactive agents rooted within a simulated world environment.

The simulation computing system can generate one or more simulation instances based on scenario data. The scenario data include one or more of a list of simulation agents to instantiate, activation behavior of each agent, termination behavior of each agent, a scenario identifier, time management data, environment data (e.g., a simulated world environment, one or more weather conditions as indicated by the list of simulation agents, etc.), integration data, evaluation data, a simulation start time, and/or a simulation time duration. The simulation computing system can generate the simulation instance(s) based on predetermined scenario data (e.g., as indicated by a scenario identifier). In addition, or alternatively, the simulation computing system can generate the simulation instance(s) based on input data indicative of one or more aspects of a simulation scenario.

For example, the simulation computing system can include a user interface configured to interact with one or more users of the simulation computing system. The user interface can be configured to receive input data (e.g., via one or more input interfaces) and/or provide output data (e.g., via one or more output interfaces). The simulation computing system can obtain (e.g., via the user interface) input data associated with a simulation instance. The input data, for example, can include one or more scenario parameters. The one or more scenario parameters can include one or more simulated agent parameters, one or more testing environment parameters, one or more evaluation parameters, one or more timing parameters, one or more integration parameters, and/or any other parameter associated with a simulation instance.

In some implementations, each of the plurality of simulation agents (e.g., of the agent database) and the plurality of simulated world environments (e.g., of the world database) can include a corresponding unique identifier. In such a case, the simulated agent parameter(s) can include a respective unique identifier for at least one simulation agent of the agent database. In addition, the one or more testing environment parameters can include another respective unique identifier for at least one simulated world environment from the world database. By way of example, the at least one simulation agent can include a simulation aerial vehicle agent. In addition, or alternatively, the at least one simulation agent can include one or more secondary simulated aerial vehicle agents and/or one or more world agents.

The simulation computing system can obtain (e.g., via the agent database) scenario agent data for a simulation instance. For example, the simulation computing system can obtain the scenario agent data based on the one or more simulation agent parameters of the input data. By way of example, each of the one or more simulated agent parameters can identify (e.g., via a unique identifier, an agent type, etc.) at least one simulated agent of the plurality of simulation agents of the agent database. In some implementations, the scenario agent data can be indicative of a simulation aerial vehicle. The simulation aerial vehicle, for example, can include one of the plurality of simulation agents of the agent database. In addition, or alternatively, the scenario agent data can be indicative of one or more secondary simulated aerial vehicle agents of the plurality of simulated aerial vehicle agents and/or one or more world agents of the plurality of simulation world agents of the agent database.

The simulation computing system can obtain (e.g., via the world database) scenario world data. For example, the simulation computing system can obtain, via the world database, the world data based, at least in part, on the one or more testing environment parameters. The one or more testing environment parameters, for example, can identify at least one simulated world environment of the plurality of simulated world environments. The scenario world data can be indicative of the at least one simulated world environment of the plurality of simulated world environments. For example, the scenario world data can include a plurality of environment variables at each time step associated with the at least one simulated world environment. As discussed herein, the simulated world environment can represent a real-world environment. For example, the simulated world environment can be based, at least in part, on real world data indicative of a prerecorded real world environment.

In addition, or alternatively, the simulation computing system can obtain integration data indicative of the one or more backend services of the transportation services system. For example, the input data can include one or more integration parameters indicative of one or more services of the transportation services system. The integration data can be based on the one or more integration parameters of the input data. The one or more backend services identified by the integration data can include one or more permitted services of the transportation services system as indicated by an access permission. For example, as discussed herein, one or more of the simulation agents (e.g., aerial vehicle agents, air traffic control agents, etc.) can typically have access to one or more backend services of the transportation services system (e.g., as defined by a behavioral engine). The integration parameters can indicate which of the backend services will be available to an agent (e.g., aerial vehicle agent) during the simulation.

In some implementations, the simulation computing system can modify the access of one or more of the simulation agents based, at least in part, on the integration data. For example, the simulation computing system can determine an access permission for a simulated agent (e.g., the simulated aerial vehicle and/or one or more other simulation agents identified by the input data (e.g., secondary aerial vehicle agents, etc.)) based, at least in part, on the integration data. An access permission, for example, can classify a service of the transportation services system as in-the-loop and/or out-of-the-loop for a respective simulation agent. A service that is classified as in-the-loop can be accessible to the respective simulation agent. A service that is classified as out-of-the-loop can be inaccessible to the respective simulation agent. In some implementations, the transportations services system can be classified as out-of-the-loop for a respective simulation instance. In such a case, each service provided by the transportation services system can be out-of-the-loop for the respective simulation instance.

The simulation computing system can determine an access permission for each simulation agent identified by the input data. During a simulation the simulation computing system can facilitate (e.g., via a simulation moderation agent) functional calls to the transportation services system made by each of the simulation agents based on the access permission associated with each simulation agent. A functional call can be forwarded in the event that a respective access permission identifies the called service as in-the-loop for the respective simulation agent. In the event that the called service is out-of-the-loop, the simulation computing system (e.g., a simulation moderation agent) can forward the call to a simulated mocked service. The simulated mocked service can return simulated returned data (e.g., a default value) in response to the function call.

In some implementations, the simulation computing system can obtain at least one evaluation parameter indicative of one or more testing metrics. For example, the input data can include the at least one evaluation parameter (e.g., allowing a user/test operator to customize the evaluated factors of a simulation). The evaluation parameter can identify one or more testing metrics for testing one or more aspects of a transportation service and/or the transportation services system. For example, an evaluation parameter can identify a testing metric to test a simulation aerial vehicle's ability to access one or more services of the transportation services system, a testing metric to test the performance of one or more services of the transportation services system under one or more transportation and/or environmental conditions, and/or any other testing metric to evaluate the performance of the transportation services system and/or the viability of one or more transportation scenarios.

The simulation computing system can obtain timing data including at least one timing parameter indicative of a simulation frequency for the simulation scenario. The simulation frequency can be indicative of real time and/or one or more modified times (e.g., an accelerated time, a decelerated time, etc.). For example, a simulation frequency indicative of real time can include a simulated time step of one second at each second of real time. In addition, or alternatively, the simulation frequency can be indicative of one or more modified times. A simulation frequency indicative of a modified time can include a modified number of one second time steps for each second of real time. By way of example, a simulation frequency indicative of an accelerated simulation time can include one or more one time steps of a second for each second of real time. As an example, the accelerated simulation frequency can include two or more second long time steps for each second of real time. As discussed herein, the simulated world environment and/or the transportation services system can be configured to iterate through one or more time steps defined by the simulation frequency during a simulation instance.

The simulation computing system can determine scenario data indicative of a simulation scenario based, at least in part, on the scenario agent data, the scenario world data, the integration data, the one or more evaluation parameters, the timing data and/or any other data relevant to real world transportation service. The scenario data can include a scenario definition defining one or more scenario parameters for the simulation scenario. The scenario definition can include all information for instantiating one simulation instance. For example, as discussed herein, a simulation scenario can include a plurality of scenario parameters including a list of simulation agents (e.g., indicated by the agent data), an activation behavior and termination behavior (e.g., defined by the agent definition associated with each agent and/or modified by the input data), time management data (e.g., indicated by the timing data), environment options (e.g., as indicated by the agent data and/or the world data), integration data (e.g., indicated by the input data), evaluation data (e.g., indicated by the evaluation parameters), a simulation start time and/or a simulation time duration. The simulation start time and/or simulation time duration, for example, can be identified by the input data or a default simulation start time or time duration.

In the event any scenario parameters are not identified by the input data and/or the scenario definition (e.g., as provided by the scenario data), the simulation computing system can use one or more default parameters. For instance, a default start time can include a current real time, a default time duration can include one or more hours, a simulation frequency can include a real time frequency (e.g., one second time step per real time second), a default environment option can include no weather, default integration data can identify each service of the transportation services system as in-the-loop for each agent of the scenario, default evaluation data can include no data collection, etc. Each of the scenario parameters can be specified before the initialization of a simulation instance based on the simulation scenario. In this manner, if not specified by the scenario definition, the default value for a respective parameter can be used for a simulation instance.

The simulation computing system can generate a first simulation instance for the simulation scenario based, at least in part, on the scenario data. The simulation instance, for example, can be generated in accordance with the scenario definition as provided for by the scenario data. The simulation instance can include the simulated aerial vehicle and/or one or more other agents within the simulated world environment. For example, the simulation instance can include one or more secondary simulated aerial vehicle agents and/or one or more environment agents identified by a scenario definition within the simulated world environment.

Each of the simulation agents can be generated relative to the simulated world environment. For instance, the simulation computing system can generate an instance of each simulation agent with attributes localized within the simulated world environment. By way of example, the aerial vehicle agent can be generated with an initial position relative to the simulated world environment. In addition, an environment agent can be generated with a wind speed at one or more locations and times relative to the simulated world environment. In this manner, the attributes of each simulation agent can be anchored within the simulated world environment.

The simulation computing system can facilitate access between one or more of the simulation agents and the one or more backend services of the transportation services system based on the integration data and the behavioral engine for each agent. For instance, the simulated aerial vehicle and/or the one or more secondary simulated aerial vehicle agents can be configured to access the one or more backend services of the transportation services system via the application programming interface platform having one or more functional calls to the one or more backend services of the transportation services system. For example, the behavioral engine for the simulated aerial vehicle and the one or more secondary simulated aerial vehicle agents can include one or more function calls at one or more times steps of the simulation instance to the backend service(s) of the transportation services system. The simulation computing system can receive a function call and facilitate each agent's (e.g., the simulated aerial vehicle) access to the one or more backend services based, at least in part, on the access permission. In this manner, the simulated aerial vehicle and/or the one or more secondary simulated aerial vehicle agents can have access to the one or more backend services of the transportation services system during the simulation instance (e.g., if permitted).

The simulation computing system can initiate the simulation instance by running the simulation instance over one or more time steps. For example, the simulation instance can be run over a simulation duration of the simulation instance. The simulation duration of the simulation instance can be defined as the earlier of either the instance at which a time duration specified by the scenario definition has passed and/or the instance at which the last entity agent has terminated (e.g., the aerial vehicle agent, one or more secondary vehicle agents, etc.). Unless specified otherwise by the scenario definition, each entity agent can terminate according to the termination behavior of the agent definition corresponding to the respective agent.

Upon initiation, the simulation computing system can initiate each respective simulation agent within the simulated world environment based on the respective activation behavior of the simulation agent. For example, unless specified otherwise by the scenario definition, each agent can be initiated according to the activation behavior of the agent definition corresponding to the respective agent. During the simulation instance, the aerial vehicle agent (and/or any other simulation entity agent) can interact with the transportation services system to obtain a transportation service assignment. In the event that the integration data prohibits interaction with the transportation services system (e.g., the transportation services system is out-of-the-loop), the simulation computing system can determine a transportation service assignment for the aerial vehicle agent (and/or any other simulation entity agent) beginning at a departure time. The departure time, for example, can be determined relative to the simulation start time.

The simulation duration can be referenced against a simulation clock. The simulation clock, for example, can begin at the start time and step through time at the frequency defined by the scenario definition (e.g., timing data of the scenario data). The simulation start time can be internally consistent (e.g., not derived from an external clock). In the event that the integration data permits interaction with the transportation services system (e.g., the transportation services system is in-the-loop), the transportation services system can reference the simulation clock to determine time for a function call to the transportation services system from an entity agent during the instantiated simulated instance.

The simulation computing system can be responsible for the initialization, commencement, and destruction of the simulation instance. The simulation instance can be commenced by starting the simulation clock. For instance, the simulation computing system can trigger the commencement of time. The commencement of time can be automatic (e.g., upon initiation) and/or manually triggered. Upon simulation completion, the simulation computing system can destruct the simulation instance gracefully. For instance, a graceful closure can include saving data collected (e.g., the evaluation data, etc.) during the simulation in one or more databases (e.g., evaluation database, etc.). The simulation computing system can manually destruct the simulation instance at any time during the simulation duration. In addition, or alternatively, the simulation computing system can automatically destruct the simulation instance upon completion of the simulation instance.

The simulation instance can maintain a reference to a simulation time (e.g., maintained by a simulation time manager). The simulation time can be defined by an anchor instance and a simulation frequency. In some implementations, the clock anchor can include epoch 0-00:00:00 UTC on 1 Jan. 1970. The clock anchor can be used in conjunction with the start time (e.g., the start time included in the scenario definition). The simulation time can increment based on the simulation frequency (e.g., as indicated by the timing parameter of the scenario data). Unless otherwise specified, the simulation frequency can include real time. At the beginning of each simulation agent's behavioral loop (e.g., as defined by a respective behavioral engine of the agent), the simulation agent can update its internal state of the present simulation time from the simulation time as indicated by the simulation clock. In this manner, the simulation instance (e.g., one or more simulated agents of the simulation instance) can iterate through one or more time steps defined by the simulation frequency.

The simulation instance can enable the interaction between each initialized simulation agent within the simulated world environment at one or more timesteps of the simulation duration. For example, the behavioral engine for the aerial vehicle agent (and/or any other agent initialized within the simulated world environment) can include a communication to one or more simulated agents within the simulated world environment. The aerial vehicle agent (and/or any other agent initialized within the simulated world environment) can have the ability to provide a request to another agent for information such as, for example, a surrounding traffic at a location within the simulated world environment. In addition, the aerial vehicle agent (and/or any other agent initialized within the simulated world environment) can have the ability to receive (e.g., in response to the request) information from another agent and update its attributes accordingly.

Each agent can follow a one or more rules when updating a respective attribute. For instance, static agent attributes (e.g., agent identifier, etc.) can be written to once during (or post) initialization by the simulation computing system. Internal attributes (e.g., attributes defined by the behavioral engine) can be read and written to by a respective behavioral engine. In some implementations, such privilege can be restricted to the respective behavioral engine. Attributes determined by one or more interfaces (e.g., sensor interface, communication interface, behavioral engine, etc.) of a respective agent can be read and written to by the respective agent (e.g., and not communicated to other agents). An entity agent can read simulated attributes from a world agent (e.g., directly and/or through a respective sensor and/or communication interface of the entity agent). The behavioral engine of a world agent can be configured to read other agents' attributes (e.g., bypassing one or more communication modules), for example, to determine a position and/or other information for the other agents.

Entity agents (e.g., the aerial vehicle agent, secondary aerial vehicle agents, air traffic control agents, etc.) can compare communicated information to other information perceived by the entity agent. For example, a respective entity agent's simulated natural values (e.g., a location of the agent as represented by the simulated world environment) can be read through the respective sensor interface of the respective entity agent and a corresponding simulated measured value (e.g., the agent's perception of its location as defined by simulated sensors of the agent) can be written, by the sensor interface, to the behavioral engine of the respective entity agent. An entity agent's respective measured value can be read by one or more other respective entity agents through a respective communications interface associated with each of the one or more other respective entity agents. For instance, an entity agent's simulated communicated values (e.g., the location as communicated by the agent) can be readable by other entity agents and written through a respective communications interface of the entity agent.

An entity agent can update its attributes based on the type of attribute received. For instance, the entity agent can update an attribute based on a simulated natural value in favor of a measured value and a communicated value. In addition, the entity agent can update an attribute based on a measured value in favor of a communicated value. By way of example, the behavioral engine of respective agent can update a location attribute based on the simulated natural value of the agent's location. In this manner, the behavioral engine simulating the behavior of a simulation entity can predict realist actions based on the simulation entities actual location within the simulated world environment. As another example, the respective agent can communicate a communicated value for a location to another agent within the simulation instance. In some implementations, the communicated value of the location can be different from the actual value for the location. Thus, by communicating the communicated value a simulation instance can simulate data loss and/or corruption through one or more communication channels.

In this manner, the simulation computing system can generate and initiate a first simulation instance with one or more interactive agents based on the scenario data. The simulation computing system can generate and initiate a plurality of simulation instances. For example, in some implementations, the simulation computing system can generate, initiate, commence, and/or destruct one or more second simulation instances based on the scenario definition of the first simulation instance and/or one or more other scenario definitions. Each simulation instance can be generated, initiated, commenced, and/or destructed independent of every other instance. For example, each simulation instance can include a segregated simulation instance state at each respective time step of a respective simulation duration. In this manner, a performance degradation in one simulation instance will not impact the performance of other active instances.

The simulation computing system can determine evaluation data for one or more of the one or more time steps based on the plurality of simulation instances. For example, the simulation computing system can determine evaluation data associated with the first simulation instance for at least one of the one or more time steps of the first simulation duration based on one or more testing metrics identified by the at least one evaluation parameter of the scenario definition. The evaluation data, for instance, can be indicative of a configuration success and/or failure rate between one or more services of the transportation services system and/or one or more simulation agents (e.g., a third party aerial vehicle agent, etc.). In this manner, the simulation computing system can help verify that vehicles (e.g., third-party autonomous vehicles, etc.) are able to fully utilize the backend services (e.g., system clients) of the transportation services system as well as complete service assignments of the service entity through one or more simulation instances.

In some implementations, the simulation computing system can be configured to obtain evaluation data at each time step of the one or more time steps. By way of example, the simulation instance can include a simulation state for each time step of the simulation instance. The simulation state can include the scenario definition, the time step and defined frequency, the environment variables at the time step, the agent state (e.g., agent attributes, predicted future behavior, etc.) of each of the simulated agents initiated within the simulation instance at the time step, an integration status (e.g., whether one or more services of the transportation services system are in-the-loop or out-of-the-loop), and/or a data collection state (e.g., one or more testing metrics for the simulation instance), etc. In some implementations, the simulation computing system can obtain evaluation data including the simulation state at each time step of the simulation instance. The simulation computing system can output, via the user interface, the evaluation data to the one or more users of the computing system and/or store the evaluation data in one or more databases such as, for example, the evaluation database.

The systems and methods described herein provide a number of technical effects and benefits. For instance, by simulating one or more functional calls to a transportation services system in a simulated environment, a computing system vehicle can safely and effectively evaluate one or more services provided by the transportation services system. Moreover, by simulating third party vehicles, a computing system can test connections between the third party systems and the transportation services system before deploying a third party vehicle as part of a transportation service. This can improve ride-sharing operations by providing a safe and realistic environment in which to test the compatibility between third parties contracted by a central service entity. In this manner, the systems and methods described herein can improve the performance of platform services and aerial vehicles when used in the real world by detecting, diagnosing, and debugging any issue within a simulation that realistically uses the platform services. Ultimately, this can lead to safer ride sharing operations by detecting and fixing issues with services or vehicles of a ride sharing system before they occur in the real world.

Example aspects of the present disclosure can provide a number of improvements to computing technology such as, for example, ride sharing and aerial transportation computing technology. For instance, the systems and methods of the present disclosure provide an improved approach for facilitating a ride sharing service using one or more aerial vehicles. For example, the computing system can obtain agent data indicative of a simulation aerial vehicle and world data indicative of a simulated world environment and determine scenario data indicative of a simulation scenario based on the obtained data. The computing system can generate a simulation instance for the simulation scenario based on the scenario data. The simulation instance can include the simulation aerial vehicle within the simulated world environment and the simulation aerial vehicle can have access to one or more backend services of a transportation services system configured to facilitate an aerial transportation service. In this manner, the computing system can employ improved techniques (e.g., simulation techniques) to test and evaluate a multi-modal ride-sharing service. Moreover, the computing system can accumulate and utilize newly available information such as, for example, agent data modelling the behavior of various real world multi-modal ride sharing entities such as aerial vehicles. In this way, the computing system provides a practical application that enables the safe evaluation and testing of a transportation services system in a realistic environment. Ultimately, this can lead to safer multi-modal ride sharing systems which can result in a more efficient allocation of transportation.

With reference now to FIGS. 1-10, example embodiments of the present disclosure will be discussed in further detail. FIG. 1 depicts a block diagram of an example system 100 according to example embodiments of the present disclosure. The system 100 can include a transportation services system 102 that can operate to control, route, monitor, and/or communicate with aircraft (e.g., VTOL aircraft) and/or one or more other transportation service entities to facilitate a multi-modal transportation service. These operations can be performed as part of a multi-modal transportation service for passengers, for example, including travel by ground vehicle and travel by aircraft (e.g., VTOL aircraft).

The transportation services system 102 can be communicatively connected over a network 180 to one or more rider computing devices 140, one or more service provider computing devices 150 for a first transportation modality, one or more service provider computing devices 160 for a second transportation modality, one or more service provider computing devices 170 for an Nth transportation modality, one or more infrastructure and operations computing devices 190, and/or one or more simulation computing devices 195.

Each of the computing devices 140, 150, 160, 170, 190, 195 can include any type of computing device such as a smartphone, tablet, hand-held computing device, wearable computing device, embedded computing device, navigational computing device, vehicle computing device, etc. A computing device can include one or more processors and a memory (e.g., similar to as will be discussed with reference to processors 112 and memory 114). Although service provider devices are shown for N different transportation modalities, any number of different transportation modalities can be used, including, for example, less than the three illustrated modalities (e.g., two modalities can be used).

The transportation services system 102 includes one or more processors 112 and a memory 114. The one or more processors 112 can be any suitable processing device (e.g., a processor core, a microprocessor, an ASIC, a FPGA, a controller, a microcontroller, etc.) and can be one processor or a plurality of processors that are operatively connected. The memory 114 can include one or more non-transitory computer-readable storage media, such as RAM, ROM, EEPROM, EPROM, one or more memory devices, flash memory devices, etc., and combinations thereof.

The memory 114 can store information that can be accessed by the one or more processors 112. For instance, the memory 114 (e.g., one or more non-transitory computer-readable storage mediums, memory devices) can store data 116 that can be obtained, received, accessed, written, manipulated, created, and/or stored. In some implementations, the transportation services system 102 can obtain data from one or more memory device(s) that are remote from the system 102.

The memory 114 can also store computer-readable instructions 118 that can be executed by the one or more processors 112. The instructions 118 can be software written in any suitable programming language or can be implemented in hardware. Additionally, or alternatively, the instructions 118 can be executed in logically and/or virtually separate threads on processor(s) 112. For example, the memory 114 can store instructions 118 that when executed by the one or more processors 112 cause the one or more processors 112 to perform any of the operations and/or functions described herein.

In some implementations, the transportation services system 102 can facilitate the ability of the user to receive transportation on one or more of the transportation legs included in an itinerary. As one example, the transportation services system 102 can interact with one or more ride-sharing networks to match the user with one or more transportation service providers 150, 160, 170. As another example, the transportation services system 102 can book or otherwise reserve a seat in, space on, or usage of one or more of the transportation modalities for the user. Additionally, or alternatively, the transportation services system 102 can simply provide information for options to be provided by one or more third parties for one or more of the transportation legs.

More particularly, in some implementations, the transportation services system 102 can respond to a user's request by determining whether it is better to fulfill the user's request using a single transportation modality or using multiple transportation modalities. As one example, the transportation services system 102 can evaluate the user's current location, request origin, and/or destination to determine which modalities of transportation are usable at such location (e.g., able to access such locations). For example, the location(s) can be checked against a list of white listed locations that have been approved for participation in various types of modalities (e.g., flight modalities for the purpose of generating a multi-modal trip itinerary). As another example, the transportation services system 102 can evaluate (e.g., generate) one or more itineraries that are single-modal and one or more itineraries that a multi-modal (e.g., inclusive of various combinations of different transportation modalities). The transportation services system 102 can compare the generated single- and multi-modal itineraries to determine whether it is appropriate to suggest a single- or multi-modal itinerary to the user. For example, one or more of the best itineraries (e.g., as evaluated based on various characteristics such as cost, time, etc.) can be suggested to the user. The user can select one of the suggested itineraries to receive transportation services in accordance with the selected itinerary.

In addition, in some implementations, the transportation services system 102 can continually re-evaluate various itineraries (e.g., single- and/or multi-modal itineraries) before and even during completion of a selected itinerary. If an improved itinerary becomes available (e.g., which may include changing from a single-modal itinerary to a multi-modal itinerary if, for example, a seat on a flight becomes available) the transportation services system 102 can suggest the improved itinerary for selection by the user. In some implementations, if the user selects the improved itinerary during completion of an existing itinerary, the transportation services system 102 can facilitate switching to the updated itinerary, including, for example, re-routing a transportation provider that is currently transporting the user to an alternative, updated destination.

In some implementations, the transportation services system 102 can include and implement logic for handling transportation service provider cancellations and/or inappropriate usage (e.g., "gaming") of the ride sharing network by the transportation service provider. As one example, in the event of a service provider cancellation or if the service provider is not making substantial progress toward fulfilling the requested transportation service, the transportation services system 102 can automatically prompt a re-handling of the rider's request (e.g., re-match to a different service provider but using the same itinerary). Alternatively, or additionally, the transportation services system 102 can automatically create a new request and perform the itinerary creation process an additional time (e.g., in the case that leg(s) of the original itinerary are accepted by a matched service provider but not fulfilled).

In addition, or alternatively to service provider cancellations, the transportation services system 102 can include and implement logic for handling user cancellations. As one example, if the user cancels the transportation request/itinerary prior to the scheduled time of pickup and/or actual pickup for the initial transportation leg, the transportation services system 102 can cancel the entire trip/itinerary. As another example, if a transportation service provider has already been matched for the initial leg, a first cancellation by the user can be treated as a request to re-match the user for the initial transportation leg. A second cancellation by the user can then result in the entire trip/itinerary being cancelled. This logic which interprets the first cancellation as a re-match request avoids cancelling the entire trip when the user is simply cancelling the match with the first service provider because the first service provider is not making substantial progress toward completing the transportation service (e.g., service provider's vehicle is not moving toward the pickup location).

According to another aspect of the present disclosure, in some implementations and scenarios, the transportation services system 102 can disable the ability of a transportation service provider to contact the user. In particular, one possible scenario is that the user is currently being transported via flight-based transportation. During flight, the user may have been matched with a ground-based transportation provider. The ground-based transportation provider may arrive at the transfer point (e.g., a destination transportation node) in advance of the user's flight and begin contacting the user (e.g., via phone call or text message) asking the user of their location and if the user is ready to engage in the ground-based transportation service. This can be a frustrating or otherwise undesirable experience for the user as the user may feel as though they are delaying the ground-based transportation service provider and/or being rushed by the ground-based transportation service provider but, because they are currently on the flight, the user is unable to take action to reduce the time until the ground-based service can be engaged. Thus, to prevent this scenario, the transportation services system 102 may disable a ground-based service provider's ability to contact the user if the ground-based service is being provided following a flight-based transportation leg and the flight-based transportation leg has not yet completed. Once the flight-based transportation leg has completed, the service provider may be re-enabled to contact the user. In some implementations, the transportation services system 102 can provide the user with status updates to keep the user informed despite disabling the service provider's ability to contact the user (e.g., "John has arrived and is ready to take you to your destination"). In some implementations, the transportation services system 102 can provide the service provider with status updates to keep the service provider informed despite disabling the service provider's ability to contact the user (e.g., "Jane's flight is delayed by 5 minutes" or "Jane's flight will arrive in 7 minutes").

In some implementations, the transportation services system 102 can perform one or more mitigation processes or routines to mitigate failure of one or legs of transportation in a multi-leg transportation itinerary. As one example, a mitigation service implemented by the transportation services system 102 can include and implement logic for responding to cancellations of flights on which a user is booked. As one example, if a planned flight is cancelled and the user has not yet initiated the itinerary or a threshold period before initiation of the itinerary has not yet been reached, then the transportation services system 102 can cancel the entire trip/itinerary. The user can be notified of the cancellation and given an opportunity to re-submit the request for transportation. However, if the user has already initiated the itinerary or a threshold period before initiation of the itinerary has been entered, the transportation services system 102 can notify the user and offer to re-route (e.g., re-plan the trip with updated information, re-match for the transportation leg with an alternative service provider, and/ or change that transportation leg to an alternative transportation modality). In some implementations, the re-routing operations can be given preference or preferential treatment (e.g., the user's use of a luxury modality may be subsidized or reduced-fare).

In some implementations, when a multi-modal itinerary has been completed, the transportation services system 102 can provide the user with a single receipt. The single receipt can detail respective portions of the final cost associated with each of the multiple legs of transportation. The transportation services system 102 can generate the single receipt by generating multiple receipts respectively for the multiple transportation legs and then stitching the multiple receipts to generate the single receipt.

More particularly, a transportation services system can receive a request from a user to facilitate a transportation service for the user from an origin to a destination. For example, the user can interact with a dedicated application on the user's computing device (e.g., smartphone, tablet, wearable computing device, or the like) to initiate the request. In response to the request, the transportation services system can generate at least one itinerary that includes transportation of the user from the origin to the destination. Specifically, the transportation services system can create an end-to-end multi-modal itinerary that includes two or more transportation legs that include travel via two or more different transportation modalities such as, for example: cars, light electric vehicles (e.g., electric bicycles or scooters), buses, trains, aircraft, watercraft, and/or other transportation modalities. Example aircrafts can include helicopters and other vertical take-off and landing aircraft (VTOL) such as electric vertical take-off and landing aircraft (eVTOL).

The vehicles can include non-autonomous, semi-autonomous, and/or fully-autonomous vehicles provided and/or maintained by one or more service providers (e.g., service providers associated with service provider computing device(s) 150, 160, 170). For instance, each vehicle can include a service entity vehicle provided and/or maintained by a service entity service provider associated with the transportation services system 102 and/or a third party vehicle provided and/or maintained by a third party service provider. As described herein, the transportation services system 102 can provide cross-platform support to third party service providers. For instance, the transportation services system 102 can provide access to one or more services of the transportation services system 102 to systems (e.g., third-party vehicle computing systems, third-party air traffic control systems, etc.) associated with third party service providers.

For example, the transportation services system 102 can include a number of different systems such as a world state system 126, a forecasting system 128, an optimization/planning system 130, and a matching and fulfillment system 132. The matching and fulfillment system 132 can include a different matching system 134 for each transportation modality and a monitoring and mitigation system 136. Each of the systems 126-136 can be implemented in software, firmware, and/or hardware, including, for example, as software which, when executed by the processors 112 cause the transportation services system 102 to perform desired operations. The desired operations, for example, can provide one or more backend services of the transportation services system 102 to one or more associated devices 140, 150, 160, 170, 190, 195. For example, the world state system 126 can provide a backend world state service. The forecasting system 128 can provide a backend forecasting service. The optimization/planning system can provide a backend routing service. And, the matching and fulfillment system 132 can provide a matching and monitoring service. The systems 126-136 can cooperatively interoperate (e.g., including supplying information to each other).

In response to a user's request, the transportation services system 102 (e.g., optimization/planning system 130) can perform one or more algorithms to generate an itinerary for the user. As an example, the transportation services system 102 can sequentially analyze and identify potential transportation legs for each different available transportation modality. For example, a most critical, challenging, and/or supply-constrained transportation leg can be identified first and then the remainder of the itinerary can be stitched around such leg. In some implementations, the order of analysis for the different modalities can be a function of a total distance associated with the transportation service (e.g., shorter transportation services result in ground-based modalities being assessed first while longer transportation services result in flight-based modalities being assessed first).

As one particular example, in some implementations, the transportation services system 102 can initially analyze a first transportation modality that is the most efficient (e.g., in terms of travel speed and/or cost) transportation modality which operates according to a fixed infrastructure. As an example, for most longer transportation services and for the mix of different modalities described above, flight modalities will often both be the most efficient transportation modality (e.g., in terms travel speed/time) while also operating according to a fixed infrastructure. By first analyzing the most efficient transportation modality which operates according to a fixed infrastructure, the transportation services system 102 can seek to identify an important transportation leg around which the remainder of the itinerary can be stitched.

More particularly, in some implementations, one or more of the transportation modalities can operate according to or within a fixed transportation infrastructure in which the ability of passengers to embark and disembark vehicles is constrained to a defined set of transportation nodes. For instance, the fixed transportation infrastructure can include a plurality of aerial vehicles (e.g., service entity aircraft, third-party aircraft, etc.) that operate within a ride sharing network facilitated by the transportation services system 102. The aerial vehicle(s) can be constrained to load and unload passengers only at a defined set of physical take-off and/or landing areas which may in some instances be referred to as aerial transport facilities.

Figure 2:
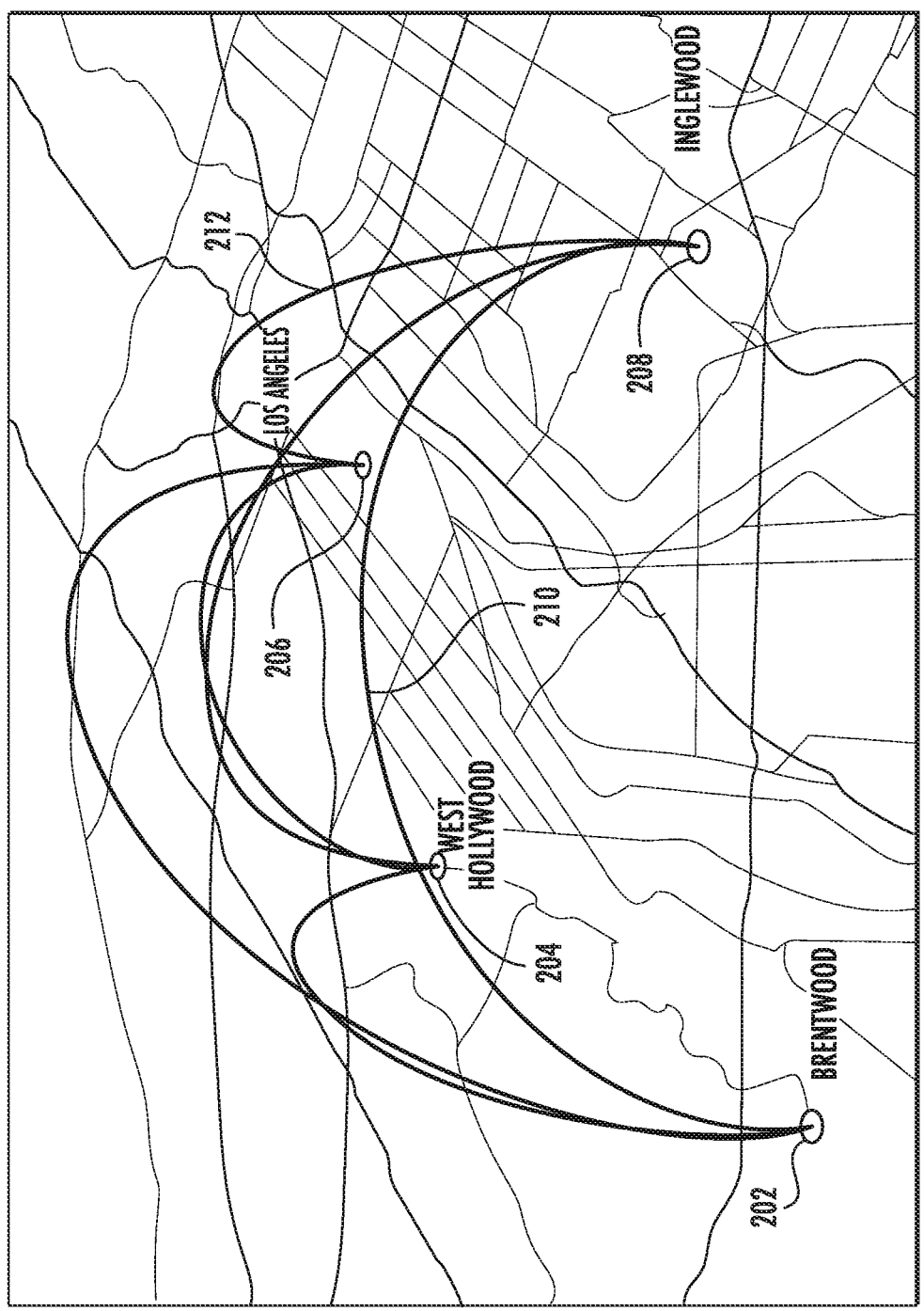
FIG. 2 depicts a graphical diagram of an example set of flight plans between an example set of aerial transport facilities according to example embodiments of the present disclosure.

By way of example, FIG. 2 depicts a graphical diagram of an example set of flight plans between an example set of aerial transport facilities according to example embodiments of the present disclosure. In particular, FIG. 2 provides a simplified illustration of an example fixed infrastructure associated with flight-based transportation in an example metropolitan area. As illustrated in FIG. 2, there are four aerial transport facilities which may be referred to as "skyports." For example, a first aerial transport facility 202 is located in a first neighborhood of the metropolitan area, a second aerial transport facility 204 is located in a second neighborhood, a third aerial transport facility 206 is located in a third neighborhood, and a fourth aerial transport facility 208 is located in a fourth neighborhood. The location and number of aerial transport facility is provided only as an example. Any number of transportation nodes at any different locations can be used.

Flights are available (e.g., may be pre-planned) between certain pairs of the aerial transport facility. For example, a flight path 210 exists between the first aerial transport facility 202 and the fourth aerial transport facility 208. Likewise, a flight path 212 exists between the fourth aerial transport facility 208 and the third aerial transport facility 206.

Figure 3:
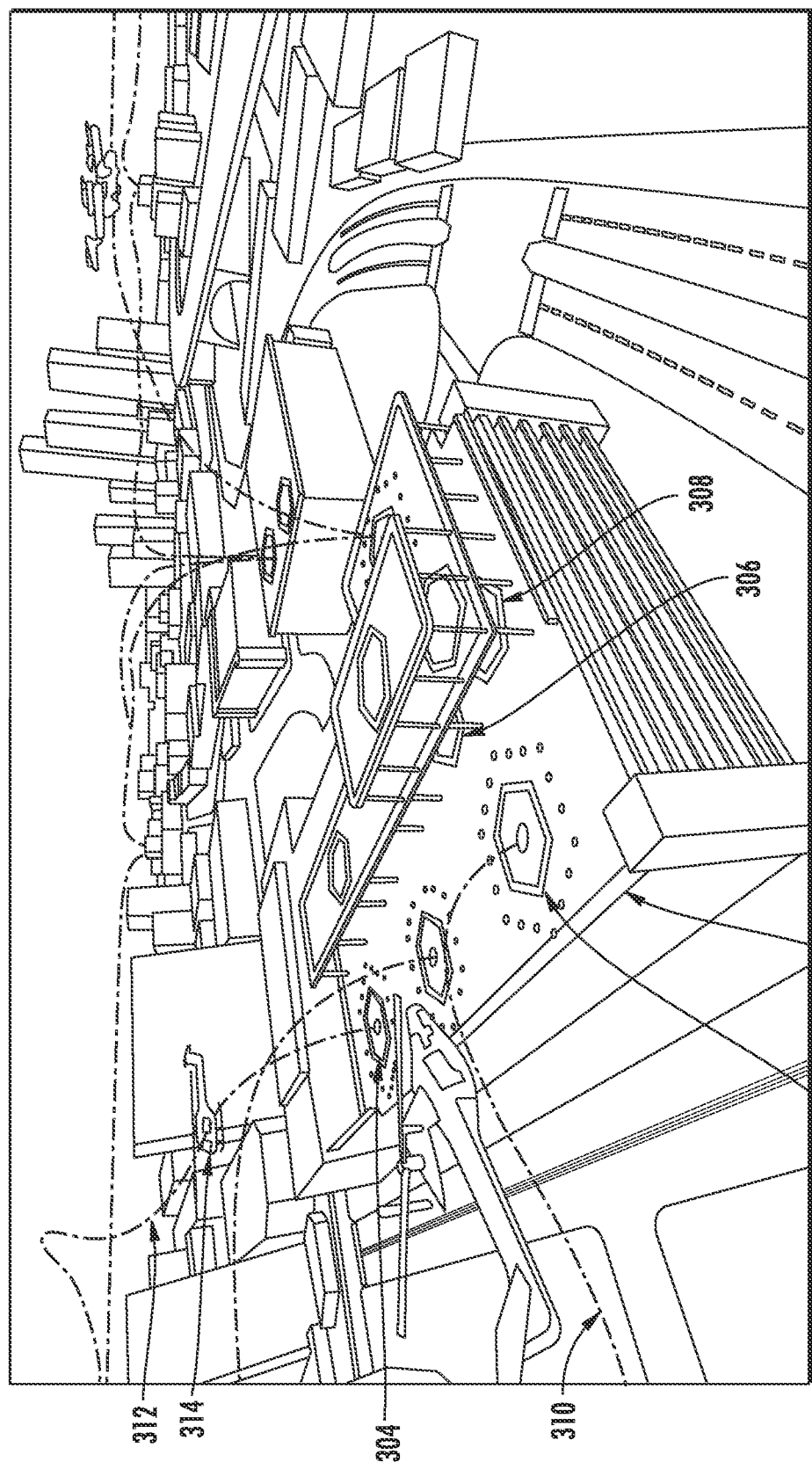
FIG. 3 depicts a graphical diagram of an example transportation node according to example embodiments of the present disclosure.

FIG. 3 depicts a graphical diagram of an example aerial transport facility 300 according to example embodiments of the present disclosure. The example aerial transport facility 300 includes a number of take-off/landing pads such as pads 302 and 304. The example aerial transport facility 300 also includes a number of vehicle parking locations such as parking locations 306 and 308. For example, re-fueling or re-charging infrastructure may be accessible at each parking location.

Flight trajectories into and out of the aerial transport facility 300 may be defined, configured, assigned, communicated, etc. FIG. 3 illustrates a number of flight trajectories including, for example, trajectories 310 and 312. The trajectories can be fixed or can be dynamically computed. The trajectories can be computed by the aircraft or can be centrally computed and then assigned and communicated to the aircraft. As one example, FIG. 3 illustrates a helicopter 314 taking off from the pad 304 according to the trajectory 312.

Turning back to FIG. 1, the use of fixed infrastructure can constrain the number and availability of service providers. As such, in some instances, the transportation services system 102 can initially identify any aerial transport facilities associated with a first transportation modality (e.g., flight modality) that are relevant to the user's request. For example, the transportation services system 102 can identify any aerial transport facilities that are within a threshold distance from the origin location as candidate departure facilities. Likewise, the transportation services system 102 can identify any aerial transport facilities that are within a threshold distance from the destination location as candidate arrival facilities.

The transportation services system 102 (e.g., an optimization/planning system 130) can pre-determine a number of planned transportation services by the service providers. For example, in some implementations, aerial vehicles of a ride-sharing network (e.g., service entity vehicles, third-party vehicles, etc.) can be scheduled and/or otherwise controlled by the transportation services system 102 in accordance with the ride sharing network. For instance, the transportation services system 102 can generate (e.g., on a daily basis) an initial pre-defined set of flight plans for the aerial vehicles of the ride-sharing network and can add and/or remove passengers from each planned flight. In some implementations, the transportation services system 102 can dynamically optimize (e.g., via an optimization and planning system 130) planned transportation services by the service providers to account for real-time changes in rider availability and demand. For example, the transportation services system 102 can dynamically modify the pre-determined flight plans (e.g., delay a planned flight departure by five minutes and/or change a planned flight to an alternative arrival transportation node).

In scenarios in which the first transportation modality operates according to pre-determined plans, after identifying the relevant aerial transport facilities, the transportation services system 102 can access a database of pre-determined transportation plans to identify candidate transportation plans between the relevant facilities. For example, the transportation services system 102 can identify any transportation plans between one of the candidate departure facilities and/or one of the candidate arrival facilities which would satisfy the user's request, including, for example, any departure or arrival time requests.

In some implementations, for example in which a transportation modality does not have pre-determined plans but instead operates in an "on-demand" nature, the transportation services system can match (e.g., via a matching and fulfillment system 132, etc.) the user with a service provider for the transportation modality from a free-floating, dynamic pool of independent transportation service providers. For example, service providers can dynamically opt in and out of the ride sharing network and the transportation services system 102 can operate to match the passenger with a service provider who is currently opted into the network. The service provider can choose to provide the service to the passenger or decline to provide the service. For example, for flight modalities, the transportation services system 102 can match the user to one of a dynamically changing pool of aerial vehicles and the aerial vehicles (e.g., a pilot of an aerial vehicle, a service provider associated with the aerial vehicle, etc.) can choose (e.g., via one or more functional calls to the matching and fulfillment system 132) to provide or decline the proposed aerial transport service.

The transportation services system 102 can identify a set of candidate transportation plans that can form the basis for building a set of potential itineraries. The transportation services system 102 can stitch additional transportation legs to each respective candidate transportation plan to generate a plurality of candidate end-to-end itineraries. The transportation services system 102 can analyze the candidate itineraries to select one or more itineraries that are high quality according to various measures. The transportation services system 102 can interact with one or more vehicles (e.g., aerial vehicles, ground vehicles, etc.) and/or one or more service providers of the one or more vehicles to enable the user to complete at least one of the one or more itineraries. The service providers, for example, can include a service entity service provider associated with the transportation services system and/or one or more third-party service providers. In some implementations, the one or more vehicles can include a human operator (e.g., driver or pilot) and/or a vehicle computing system.

Figure 4:
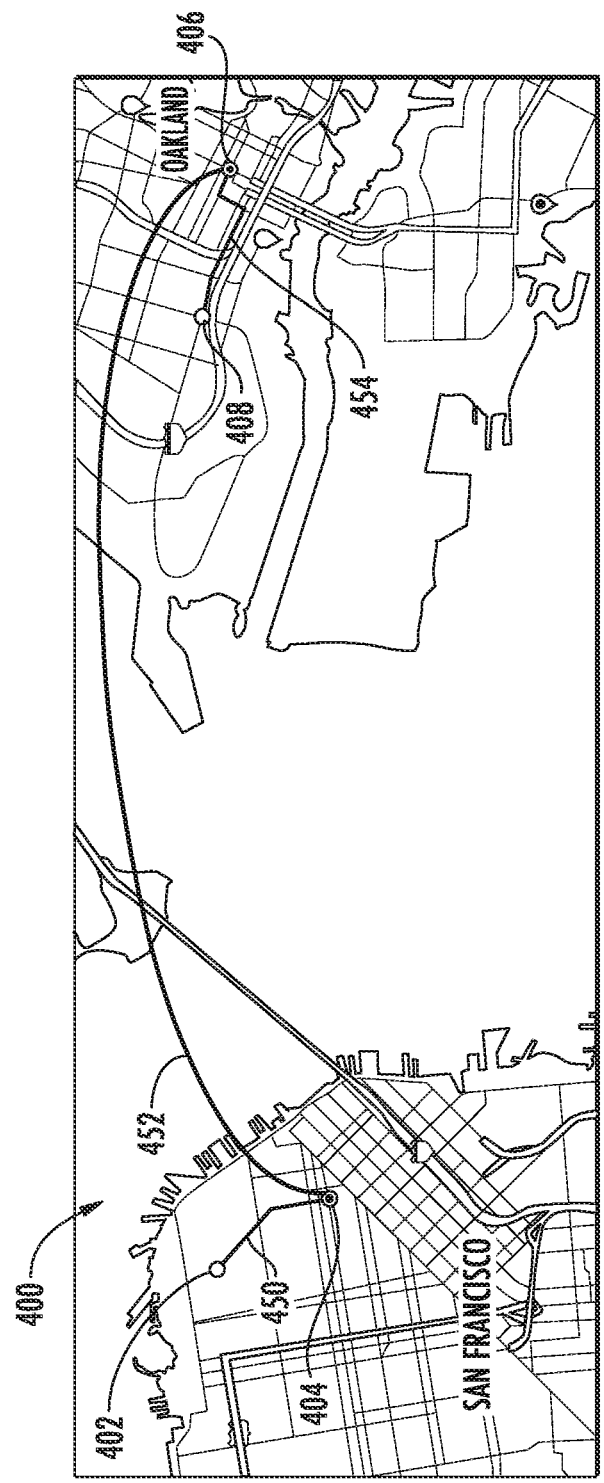
FIG. 4 depicts a graphical diagram of an example multi-modal transportation service itinerary according to example embodiments of the present disclosure.

With reference to FIG. 4, FIG. 4 depicts a graphical diagram of an example multi-modal transportation service itinerary 400 according to example embodiments of the present disclosure. The itinerary 400 includes three transportation legs to transport the user from an origin 402 to a destination 408. In particular, the itinerary 400 includes a first, ground-based (e.g., car-based) transportation leg 450 which transports the user from the origin 402 to a departure transportation node 404; a second, flight-based transportation leg 452 which transports the user from the departure transportation node 404 to an arrival transportation node 406; and a third, ground-based (e.g., car-based) transportation leg 454 which transports the user from the arrival transportation node 406 to the destination 408.

As discussed herein, the transportation services system 102 can include a number of subsystems configured to provide a plurality of backend services to facilitate a transportation service. By way of example, the optimization/planning system 130 can provide a backend an itinerary service to generate one or more itineraries for a user in accordance with the procedures described herein. In addition, the system 130 can provide a backend routing service to determine one or more flight plans, routes, skylanes, etc. for vehicles associated with transportation service. The world state system 126 can operate a state monitoring service to maintain data descriptive of a current state of the world (e.g., a predicted transportation demand, flight assignments, operational statuses and locations of a plurality of vehicles, etc.). The forecasting system can operate a forecasting service to generate predictions of transportation demand, weather forecasts, and/or any other future looking data helpful for completing a transportation service.

More particularly, the world state system 126 can operate to maintain data descriptive of a current state of the world. For example, the world state system 126 can generate, collect, and/or maintain data descriptive of predicted rider demand; predicted service provider supply; predicted weather conditions; planned itineraries; pre-determined transportation plans (e.g., flight plans) and assignments; current requests; current ground transportation service providers; current aerial transport facility operational statuses (e.g., including re-charging or re-fueling capabilities); current aerial vehicle statuses (e.g., including current fuel or battery level); current pilot statuses; current flight states and trajectories; current airspace information; current weather conditions; current communication system behavior/protocols; and/or the like. The world state system 126 can obtain such world state information through communication with some or all of the devices 140, 150, 160, 170, 190, and/or 195. For example, devices 140 can provide current information about riders while devices 150, 160, and 170 can provide current information about service providers. Devices 190 can provide current information about the status of infrastructure and associated operations/management. And, devices 195 can provide simulated information associated with a simulated world environments at a current time step as described in more detail herein.

The forecasting system 128 can generate predictions of the demand and supply for transportation services at or between various locations over time. The forecasting system 128 can also generate or supply weather forecasts. The forecasts made by the system 128 can be generated based on historical data and/or through modeling of supply and demand. In some instances, the forecasting system 128 can be referred to as an RMR system, where RMR refers to "routing, matching, and recharging." The RMR system can be able to simulate the behavior of a full day of activity across multiple ride share networks. By way of example, the RMR system can have access to one or more trajectory prediction libraries that can include one or more models or algorithms configured to determine the predicted behavior of one or more entities associated with a transportation service.

The optimization/planning system 130 can generate transportation plans for various transportation assets and/or can generate itineraries for riders. For example, the optimization/planning system 130 can perform flight planning. As another example, optimization/planning system 130 can plan or manage/optimize itineraries which include interactions between riders and service providers across multiple modes of transportation.

The matching and fulfillment system 132 can match a rider with a service provider for each of the different transportation modalities. For example, each respective matching system 134 can communicate with the corresponding service provider computing devices 150, 160, 170 via one or more APIs or connections. Each matching system 134 can communicate trajectories and/or assignments to the corresponding service providers. Thus, the matching and fulfillment system 132 can perform or handle assignment of ground transportation, flight trajectories, take-off/landing, etc.

The monitoring and mitigation system 136 can perform monitoring of user itineraries and can perform mitigation when an itinerary is subject to significant delay (e.g., one of the legs fails to succeed). Thus, the monitoring and mitigation system 136 can perform situation awareness, advisories, adjustments and the like. The monitoring and mitigation system 136 can trigger alerts and actions sent to the devices 140, 150, 160, 170, 190, and 195. For example, entities such as riders, service providers, operations personnel, and/or a simulation entity representing any of the aforementioned entities can be alerted when a certain transportation plan has been modified and can be provided with an updated plan/course of action. Thus, the monitoring and mitigation system 136 can have additional control over the movement of aerial vehicles, ground vehicles, air traffic controllers, pilots, and riders.

In some implementations, the transportation services system 102 can also store or include one or more machine-learned models. For example, the models can be or can otherwise include various machine-learned models such as support vector machines, neural networks (e.g., deep neural networks), decision-tree based models (e.g., random forests), or other multi-layer non-linear models. Example neural networks include feed-forward neural networks, recurrent neural networks (e.g., long short-term memory recurrent neural networks), convolutional neural networks, or other forms of neural networks.

The infrastructure and operations computing devices 190 can be any form of computing device used by or at the infrastructure or operations personnel including, for example, devices configured to perform passenger security checks, luggage check in/out, re-charging/re-fueling, safety briefings, vehicle check in/out, and/or the like.

The network(s) 180 can be any type of network or combination of networks that allows for communication between devices. In some embodiments, the network(s) can include one or more of a local area network, wide area network, the Internet, secure network, cellular network, mesh network, peer-to-peer communication link and/or some combination thereof and can include any number of wired or wireless links. Communication over the network(s) 180 can be accomplished, for instance, via a network interface using any type of protocol, protection scheme, encoding, format, packaging, etc.

The transportation services system 102 can interact with various service providers (e.g., third-party service providers, service entity service providers, etc.) and/or other entities (e.g., rider computing device(s) 140, infrastructure and operations computing device(s) 190, etc.) over the network(s) 160. To do so, the transportation service system 102 can include an application programming interface platform to facilitate services between the service entity infrastructure (e.g., the services of the transportation services system 102, service entity service providers, etc.) and third party service providers. The API platform can include one or more functional calls to the backend services (e.g., world state services, forecasting services, routing services, optimization and planning services, matching services, monitoring services, etc.) of the transportation services system 102. By way of example, the one or more functional calls can be configured to communicate a request and/or data between one or more subsystems (e.g., world state system 126, forecasting system 128, optimization/planning system 130, matching and fulfillment system 132, matching system 134, monitoring and mitigation system 136, etc.) of the transportation services system 102 and one or more transportation entities associated with a transportation service (e.g., aerial vehicles, air traffic controllers, ground vehicles, pilots, passengers, etc.).

The one or more functional calls can be defined to be accessed by the service entity (e.g., vehicles and/or other transportation entities of the service entity), one or more third party service providers (e.g., vehicles and/or other transportation entities of the third party service providers, etc.), etc. In this manner, the API platform can facilitate access to back-end services (e.g., provided by backend systems of the transportation services system 102) to aerial vehicles associated with one or more different service providers. By way of example, the API platform can provide access to services provided by the transportation services system 102 such as world state services, a forecasting services, an optimization/planning services, and/or any other service provided by the transportation services system 102.

According to aspects of the present disclosure, the system can include simulation computing system including simulation computing devices 195. The simulation computing devices 195 can test the services provided by the transportation services system 102 by simulating a plurality of real-time ride sharing scenarios with a plurality of different aerial vehicles and/or other transportation entities (e.g., air traffic controllers, aerial transport facilities, etc.) associated with providing a transportation service. To do so, the simulation computing devices 195 can generate a simulation instance based on a simulation scenario identifying a plurality of simulation agents and a simulated environment in which the simulation agents may interact. The simulation agents, for example, can include one or more agents configured to represent real life counterparts such as, for example, service entity vehicles, third-party vehicles, air traffic controller systems, passengers, pilots, ground vehicles, aerial transport facility systems, etc. As described herein, the one or more agents can have access to one or more backend services of the transportation services system 102 during a simulation such that one or more of the backend services of transportation services system 102 can be utilized within the simulated environment.

Figure 5:
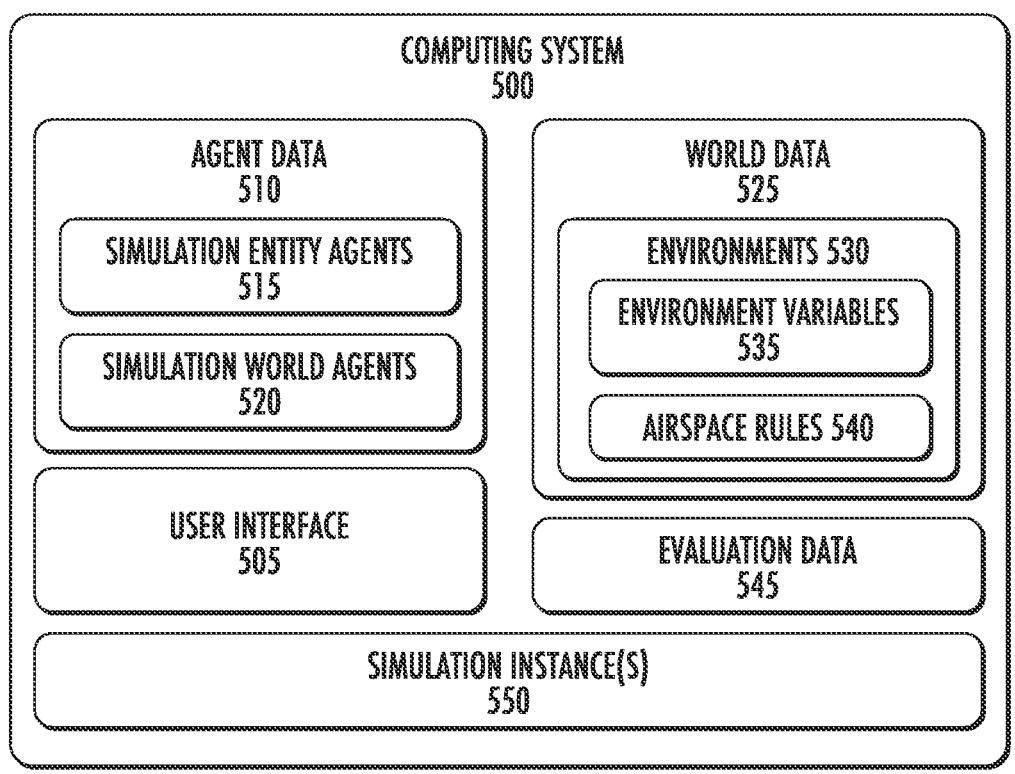
FIG. 5 depicts example simulation instance(s) according to example implementations of the present disclosure.

FIG. 5 depicts an example simulation computing system 500 according to example implementations of the present disclosure. The simulation computing system 500 can include a user interface 505, agent data 510, world data 525, evaluation data 545, and one or more simulation instance(s) 550. For example, the simulation computing system 500 can have access to one or more simulation databases such as, for example, an agent database storing agent data 510, a world database storing world data 525, an evaluation database storing evaluation data 545, and/or any other database storing information relevant to a simulation and/or transportation service. For example, the agent database can include agent data 510 indicative of a plurality of simulation agents 515, 520, the world database can include world data 525 indicative of a plurality of simulated world environments 530, and the evaluation database can include evaluation data 540 for evaluating one or more aspects of the transportation services system according to one or more evaluation metrics.

For example, the world data 525 can include data indicative of a plurality of simulated world environments 530 representing real world conditions within a simulation instance. Each of the simulated world environment(s) 530 can represent a real world environment over a period of time (e.g., one or more minutes, hours, days, etc.). For example, a simulated world environment 530 can include a plurality of environment variables 535 (e.g., wind speed, humidity, temperature, cloud coverage, etc.) and/or airspace rules 540 (e.g., altitude constraints, speed constraints, temporary flight restrictions, etc.) for each of a plurality of locations (e.g., simulated geographic coordinates, altitudes, etc.) and each of a plurality of time steps (e.g., seconds, minutes, etc.) associated with the simulated world environment 530. An environment variable 535, for example, can include a wind speed across one or more simulated geographic coordinates at one or more simulated altitudes during one or more seconds within the simulated environment 535. By way of example, the wind speed can be dynamic, being a function of time, position, and altitude, and thus the wind speed can be represented by a three-dimensional vector indicating a direction, speed, etc. As another example, an airspace rule 540 can include a temporary flight restriction for one or more simulated geographic coordinates at one or more simulated altitudes during one or more minutes within a simulated environment 530.

In some implementations, the world data 525 indicative of a simulated world environment 530 can include prerecorded real world data. For example, a simulated world environment 530 can include a representation of real world conditions over a recorded time period. By way of example, a simulated world environment 530 can represent a plurality of real world environmental conditions (e.g., environmental variables 535) and/or airspace rules (e.g., airspace rules 540) in effect between one or more aerial transport facilities of a service entity infrastructure. For instance, the world data 525 for a simulated world environment 530 can be prerecorded by one or more aerial vehicles (e.g., service entity aerial vehicles, third party vehicles, etc.) and/or other devices (e.g., weather sensors, noise sensors, etc.) during the performance of one or more transportation services. In addition, or alternatively, the world data 525 can include other recorded information for the area covered by the respective simulated world environment such as, for example, weather reports from weather stations, air traffic restrictions from air traffic controllers, and/or any other information relevant for providing a transportation service. As discussed herein, a simulated world environment 530 can provide data in which a plurality of simulated agents can interact to create simulation instance 550.

For example, the agent database can include agent data 510 for each of a plurality of simulation agents 515, 520. The simulation agents 515, 520 can include a plurality of simulation entity agents 515 and a plurality of simulation world entities 520. Each of the simulation agents 515, 520 can include an agent definition that captures agent behavior expected at every simulation iteration over time (e.g., as defined by a simulation time discussed herein). For instance, a simulation entity agent 515 can model the behavior of a real life entity counterpart. By way of example, a simulation entity agent 515 can include an aerial vehicle agent (e.g., service entity aerial vehicle agent, third-party aerial vehicle agent, etc.), an air traffic controller agent, a passenger agent, a pilot agent, a ground vehicle agent, an aerial facility agent, and/or an agent for any other entity associated with a transportation service. As an example, a simulation aerial vehicle agent can model characteristics (e.g., weight capacity, speed, operating systems, etc.) of one or more different aerial vehicles. As another example, a passenger agent can model characteristics (e.g., a multi-modal itinerary, booking tendencies, movement information, etc.) of a passenger interacting with a transportation service. A passenger agent, for example, can be configured to book a flight, reschedule a flight, miss/arrive late for a booked flight (with or without luggage, etc.), and/or perform any other action within a simulated world environment.

In addition, or alternatively, a simulation world agent 520 can model the behavior of one or more world conditions such as, for example, environmental conditions. For instance, the simulation world agent 520 can include a weather agent, a wind agent, a rain agent, a moderation agent, and/or any an agent for any world condition associated with a transportation service (e.g., a defined by a respective simulated world environment 530).

Each simulation agent 515, 520 can be defined by an agent definition that models the simulation agent's behavior within a simulated world environment 530. By way of example, an agent definition can include an activation behavior, a termination behavior, one or more agent attributes, and/or agent interface data defining one or more agent interfaces and/or engines. The activation behavior, for example, can define one or more characteristics for an agent upon initialization. By way of example, an activation behavior for an aerial vehicle agent can include a location within a simulated world environment 530 (e.g., an aerial facility represented by the simulated world environment 530, a location within a route being traversed by the aerial vehicle, etc.), a scheduled transportation service, an initial state (e.g., initial speed, progress of a transportation service), and/or any other information relevant to providing a transportation service. The activation behavior, when triggered, can result in the complete execution of the agent definition at every simulation iteration over a simulation duration.

The termination behavior can define one or more characteristics for an agent that can trigger its destruction within a simulation instance. By way of example, the termination behavior can be indicative of a location within a simulated world environment 530 (e.g., a simulated aerial facility that, once reached by an aerial vehicle, signifies the completion of a transportation service, etc.), a time period (e.g., a duration of simulated time within a simulation instance 550, etc.), and/or any behavior associated with a transportation service. The activation and/or the termination behavior can be predetermined (e.g., a default activation/termination behavior included in the agent definition) and/or dynamically determined for each simulation scenario (e.g., defined by input data to the simulation computing system 500, etc.).

Agent attributes can include any information relevant for defining an agent's position and behavior within a simulated world environment 530. For example, agent attributes can include a unique identifier, one or more current positions within a simulated world environment 530, one or more assignments, an agent type (e.g., type of environment condition (e.g., wind, temperature, noise, etc.), type of aircraft (e.g., drone, helicopter, VTOL, etc.), affiliation (e.g., service entity vehicle, third party vehicle, etc.), etc.), and/or one or more agent attributes specific to the agent 515, 520 and the simulated world environment 530. By way of example, an agent definition defining an aerial vehicle agent have attributes including: an agent type (e.g., electric vertical take-off and landing type, a drone type, helicopter type, etc.), a service entity affiliation (e.g., service entity aerial vehicle, third-party service provider aerial vehicle, etc.), a unique identifier (e.g., a tail number), an assigned flight number (e.g., indicative of a transportation service assigned to the aerial vehicle agent), an origin location, a destination location, a route, a predicted trajectory, a contingency plan, a current flight phase, a current time stamped position, a subsequent flight phase, a subsequent time stamped position, a subsequent waypoint, a future predicted trajectory, and/or any other information relevant for an aerial vehicle to complete a transportation service.

In some implementations, agent attribute(s) for agents 515, 520 can include multiple values. For example, a simulation agent 515, 520 can distinguish intent between various values within a simulation that conceptually represent the same agent attribute. For example, an agent attribute can include one or more simulated natural, measured, and/or communicated instance values indicative of the simulated world environment 530 relative to a simulation agent 515, 520. The instance values, for example, can include an agent location within the simulated world environment at any given time step of the simulation instance, a wind speed at the agent location (e.g., for a vehicle agent preparing to take off, progressing through a simulated vehicle route, etc.), an agent speed (e.g., a wind speed for a weather agent, a vehicle speed for an aerial/ground vehicle agent, etc.), a noise level (e.g., a threshold level of noise at the agent location, a level of existing noise at the agent location, a level noise produced by the agent, etc.), and/or any other value relevant to a respective agent and/or a transportation service.

Each instance value can be classified as natural, measured, and/or communicated. A natural instance value can represent the actual state (e.g., true position) of a respective agent within the simulated world environment. The measured instance value can represent the natural instance value as interpreted by a simulated measurement device (e.g., a simulated global positioning system, etc.) as represented by a sensor interface of an agent 515, 520. The communicated instance value can represent a measured instance value that is made know to another agent and/or services associated with a simulation instance 550 (e.g., backend services of the transportation services system) through a communication interface of an agent 515, 520. In addition, or alternatively, the instance values can include engine internal instance values that can aid in the execution of an agent's behavioral engine.

In this manner, a simulation agent 515, can include multiple notions of its own position at any given time within a simulation instance 550. Its position can include, for example, its true position (e.g., as indicated by the simulated world environment), its sensed position (e.g., the position obtained by a sensor interface simulating sensors of the simulation agent 515, 520), a predicted position (e.g., a position predicted by a behavioral engine of the simulation agent 515, 520), and/or a communicated position (e.g., a position communicated by the simulation agent 515, 520). In this respect, agent attribute(s) can include simulated instance values (e.g., a true position) modeling a corresponding attribute of the real entity represented by the agent and simulation instance values (e.g., a sensed position, communicated position, etc.) determined by the simulation agent 515, 520 during a simulation instance 550.

Agent interface data can be indicative of one or more agent interfaces for each of the plurality of simulation agents 515, 520. The one or more agent interfaces, for example, can define a sensor interface configured to determine one or more measured values, a communications interface configured to communicate (e.g., receive, transmit, etc.) data (e.g., measured value(s), etc.) within a simulated world environment 550, a behavioral engine defining one or more dynamic behaviors of a respective simulation agent 515, 520, and/or any other interfaces defining how a respective simulation agent 515, 520 interacts within a simulated world environment 550. In some implementations, an agent type can define the configuration of each of the one or more agent interfaces.

A sensor interface, for example, can be configured to determine one or more measured values based, at least in part, on at least one of the plurality of environment variables 535 of a simulated world environment. The sensor interface can model the actual measurement of real-world data. The communications interface can be configured to communicate one or more simulated messages (e.g., indicative of the one or more natural and/or measured values) with one or more secondary simulation agents and/or services associated with a simulation instance. The communications interface can model the actual transmission of real-world data. In addition, in some implementations, a communications interface can provide natural values to one or more simulation agents 515, 520. For example, a simulation world agent 520 can provide a natural value (as indicative by an environment variable 535 of a simulated world environment 530) to a simulation entity agent 515 via a communication interface of the simulation world agent 520. As described in detail below, the natural value can pass through the one or more interfaces of the simulation entity agent 515. In this manner, an internal engine (e.g., the behavior engine) can determine behaviors affected by natural values of the simulated world environment 530.

For example, a simulation agent 515, 520 can include a behavioral engine configured to characterize the performance and dynamic behaviors of the simulation agent 515, 520. A behavioral engine can include a plurality of rules of behavior defining the dynamic behavior of a simulation agent 515, 520. For example, the rules of behavior can define one or more predicted behaviors of a simulation agent 515, 520. For instance, the dynamic behavior(s) of a simulated aerial vehicle agent can be defined based, at least in part, on a predicted behavior for an aerial vehicle corresponding to the simulated aerial vehicle. In some implementations, the rules of behavior can be determined based on the type of simulation agent. As examples, aerial vehicle agents can be associated with one or more common rules of behavior defining flight characteristics of an aerial vehicle, air traffic controller agents can be associated with one or more common rules of behavior defining routing characteristics of an air traffic controller, passenger agents can be associated with one or more common rules of behavior defining human characteristics of a passenger, etc.

Predicted behaviors can be determined for a respective simulation agent, by a behavioral engine, based on one or more agent dynamics models configured to predict the behavior of the simulation agent 515, 520. In some implementations, the predicted behaviors can be determined based on real world data. By way of example, a simulation aerial vehicle agent can include a behavioral engine with one or more aerial dynamics models configured to predict the trajectory of the simulation aerial vehicle agent based on one or more conditions of a simulated world environment 530. The one or more aerial dynamics models can be determined based on real world observations. For example, the models can include machine-learned predictive models learned over real world ground truths.

In some implementations, the behavioral engine for a respective simulation agent 515, 520 can determine a behavior of the agent 515, 520 based on interactive input (e.g., via user interface 505). The interactive input can include one or more agent commands defining one or more desired actions for a respective agent 515, 520. For example, the interactive input can include entity commands for simulation entity agent(s) 515 instantiated within the simulation instance 550. The entity commands, for example, can include passenger commands for passenger agents, aerial vehicle commands for aerial vehicle agents, air traffic controller commands for air traffic controller agents, pilot commands for pilot agents, ground vehicle commands for ground vehicle agents, aerial facility commands for aerial facility agents, etc. As other examples, the interactive input can include world commands for simulation world agents 520 instantiated within the simulation instance(s) 550. The world commands, for example, can include weather commands for a weather agent, wind commands for a wind agent, rain commands for a rain agent, moderation commands for a moderation agent, and/or any other command for any world condition associated with a transportation service (e.g., as defined by a respective simulated world environment 530).

As an example, the passenger commands can include commands to cause a respective passenger agent to book a flight (e.g., simulated flight, etc.), cause a delay, miss a booked flight, and/or any other interaction with one or more other agents within a simulation instance 550. As another example, the aerial vehicle commands (and/or pilot commands) can include steering commands (e.g., affecting the movement of the simulated aerial vehicle, etc.) and/or commands defining any other dynamic vehicle behavior within a simulation instance 550. In addition, or alternatively, the weather commands, wind commands, rain commands, etc. can include environmental commands defining a dynamic change in the simulated world environment such as sudden rain fall, modifications of wind speeds at one or more locations, etc.

In some implementations, the interactive input can include real-time information associated with an agent counterpart operating in the real world. For example, the interactive input can include aerial vehicle (and/or pilot) commands to change a position, steering angle, etc. of a simulation aerial vehicle agent in accordance with tracked (and/or recorded) characteristics of a corresponding aerial vehicle operating within the real world. In addition, or alternatively, the interactive input can include environmental commands to change an environmental condition (e.g., humidity, wind speed, etc.) in accordance with real-time changes within an environment (e.g., based on environmental sensors, etc.). In this manner, simulation agent 515, 520 behavior can be modeled after the real-time behavior of real agent counterparts. In this way, a simulation agent behavior can be scripted (e.g., predetermined based on a behavioral engine, one or more behavioral rules, etc.) and/or based on real-time inputs (e.g., tracked locations, speed, etc. of a real counterpart to a simulation agent). Moreover, at any time during the simulation instance(s) 550, the behavior of an agent 515, 520 can be interchangeable between scripted behavior and/or real-time behavior modeling the behavior of a real counterpart for a respective simulation agent.

At times, a behavior engine (and/or interactive input) can cause a simulation agent 515, 520 to interact with one or more backend services of a transportation service system (e.g., transportation services system 102). In such a case, the behavior engine can include one or more functional calls to one or more services of the transportation services system. As an example, a behavioral engine for a simulation aerial vehicle 515 can include one or more functional calls to a routing service of the transportation services system to obtain a route for a simulated transportation service. In some implementations, the predicted trajectory for the simulated aerial vehicle agent can be determined by the behavioral engine based on an interaction with one or more services of the transportation services system (e.g., the predicted trajectory can carry out a route received from the transportation services system).

As discussed herein, simulation entity agents 515 can include a simulation aerial vehicle agent representing the behavior and attributes of a corresponding real-life aerial vehicle. More specifically, an aerial vehicle agent can include a service entity aerial vehicle agent representing the behavior and attributes of a service entity aerial vehicle (e.g., an aerial vehicle owned, leased, and/or controlled by the service entity), a third party aerial vehicle agent representing the behavior and attributes of a third party aerial vehicle (e.g., an aerial vehicle owned, leased, and/or controlled by the service entity), and/or a hybrid aerial vehicle agent representing the behavior and attributes of an aerial vehicle currently running outside of a simulation instance 550.

A service entity aerial vehicle agent can simulate the behavior of a real service entity aerial vehicle flying a route in an airspace while interacting with one or more backend services of the transportation services system and/or one or more other agents within a simulation instance 550. For instance, the service entity aerial vehicle agent can be defined by a behavioral engine modeling the behavior of a real world service entity aerial vehicle. For example, the behavioral engine can have access to a trajectory prediction service (e.g., one or more predictive models) that computes a trajectory for the service entity aerial vehicle agent as if the service entity aerial vehicle agent is operating in the real world. The behavioral engine can utilize one or more advanced aircraft dynamics using sensor models (e.g., one or more machine-learned models). The sensor models can alter a predicted trajectory for the service entity aerial vehicle agent based on a condition present by the simulated world environment 530.

For example, the behavioral engine of the service entity aerial vehicle agent can be described by one or more rules of behavior. The rules of behavior can include computing the current state vector and position of the service entity aerial vehicle agent, computing the future trajectory from the current position, computing and/or updating an estimated time of arrival along a route, and/or determining and updating its flight phase during the trip. In some implementations, the rules of behavior can include one or more interactions with the transportation services system.

For example, a service entity aerial vehicle agent can receive a transportation service assignment from the transportation services system. In such a case, the rules of behavior can include providing the estimated time of arrival to the transportation services system, requesting a route to complete the transportation service assignment, requesting a contingency route, requesting route information and/or any other interaction to facilitate the service assignment. The rules of behavior can include a functional call to the transportation services system to provide the estimated time of arrival. The functional call can be called by the service entity aerial vehicle agent as if the service entity aerial vehicle agent is a real service entity aerial vehicle operating in the real world. By way of example, the service entity aerial vehicle agent can make the functional call using preexisting software used and/or to be used (e.g., in a testing phase) by a real service entity aerial vehicle. In this manner, an issue with a functional call to a service by the service entity aerial vehicle agent and/or an issue with the implementation of the called service can identify a potential issue with the transportation services system and/or the real service entity aerial vehicle corresponding to the service entity aerial vehicle agent.

A third party aerial vehicle agent can simulate the behavior of a real third party aerial vehicle flying a route in an airspace while interacting with one or more backend services of the transportation services system and/or one or more other agents within a simulation instance. For instance, the third party aerial vehicle agent can be defined by a behavioral engine modeling the behavior of a real world third party aerial vehicle in the same manner discussed above with reference to the service entity aerial vehicle agent. The rules of behavior can include a function call to the transportation services system as if the third party aerial vehicle agent is a real third party aerial vehicle. As discussed herein, the third party aerial vehicle agent can include a simulated third party aerial vehicle (e.g., a simulation entity agent representing the behaviors and attributes of a real third party aerial vehicle). In this way, the simulated third party aerial vehicle can make the functional call using preexisting software used and/or to be used (e.g., in a testing phase) by a real third party aerial vehicle. In this manner, an issue with a functional call to a service by the third party aerial vehicle agent and/or an issue with the implementation of the called service can identify a potential issue with the transportation services system and/or the real third party aerial vehicle corresponding to the third party aerial vehicle agent.

A behavioral engine can be defined for each of the simulation entity agents in a similar manner. For example, a behavioral engine can be defined for a simulated autonomous airspace agent. The rules of behavior of the behavioral engine can include functional calls to the transportation services system such as, for example, functional call to build a departure queue, build an arrival queue, call one or more services to obtain a route selection, operation creation, scheduler, sequencing, and/or any other functions provided by the transportation services system. Additional behavioral engines can be defined for simulation passenger agents, pilot agents, ground vehicle agents, facility agents, communications agents, surveillance agents, etc.

In some implementations, the simulation agent can include a hybrid aerial vehicle agent. A hybrid aerial vehicle agent can simulate the behavior of a real aerial vehicle currently flying a route in an airspace while interacting with one or more backend services of the transportation services system and/or one or more other agents within a simulation instance 550. For example, a hybrid aerial vehicle agent can derive one or more attributes from an external source (e.g., a real aerial vehicle) and simulate the derived attributes within a simulation instance 550. The real aerial vehicle can fly along a route prescribed by a routing service within the real world. The hybrid aerial vehicle agent can represent this real aerial vehicle within the simulation. Data associated with the real aerial vehicle can be acquired and analyzed within the context of the simulation, as described herein. In this manner, the simulation computing system 500 can generate hybrid simulation instances with one or more predetermined simulation agents 515, 520 from the agent database and/or one or more dynamically determined simulation agents (hybrid aerial vehicle agents) modeling the behaviors of currently active real world vehicles.

As discussed above, the simulation agents 515, 520 can include one or more world agent(s) (e.g., a weather agent, etc.) configured to model the behavior of one or more aspects of the simulated world environment 530. The world agent(s) 520, for example, can mirror a world condition (e.g., wind, flight restrictions, etc., as indicated by a simulated world environment 530). World agents 520 can interact with the simulated world environment 530 and a world state (e.g., a simulated world environment 530 at a particular time step) to act as mediums between simulation entity agents 515 and/or the simulated world environment 530. For instance, a world agent 520 can include a simulation moderation agent that can model the interaction between aerial vehicle agents, the simulated world environment 530, and/or one or more services of the transportation services entity. As an example, the moderation agent can monitor data indicative of a current simulated world state (e.g., variables of a simulated world environment 530 at a particular time step). The moderation agent can accept a functional call (e.g., a weather forecast request) to a service (e.g., offered by a forecasting system) of the transportation services system from a simulation entity agent 515 and forward (e.g., based on integration data described below) the functional call with data indicative of the current simulated world state to the service of the transportation services system. The service can return data (e.g., a forecast) based on the data indicative of the current simulated world state to the moderation agent which can forward the returned data to the simulation agent 515.

In addition, or alternatively, a world agent 520 can include a weather agent modeling the weather of a simulated world environment 530. The weather agent can include a plurality of environment agents for each weather condition (e.g., rain agent, wind agent, humidity agent, temperature agent, etc.). Each environment agent can model a condition of the simulated world environment 530 as indicated by one or more environment variables 535 and/or airspace rules 540 of the simulated world environment 530. By way of example, a respective humidity agent can represent the humidity of a pre-recorded environment during a recording time period, a respective wind agent can represent a wind direction and/or velocity of a pre-recorded environment during a recording time period, etc. The weather agent (e.g., one or more environment agents) can interact with one or more other agents (e.g., vehicle agents, etc.) of a simulation instance 550 to provide weather information (e.g., as indicated by the one or more environment variables 535) to the one or more other agents. In this manner, the simulation computing system 500 can generate a simulation instance with a plurality of interactive agents 515, 520 rooted within a simulated world environment 530.

Figure 6:
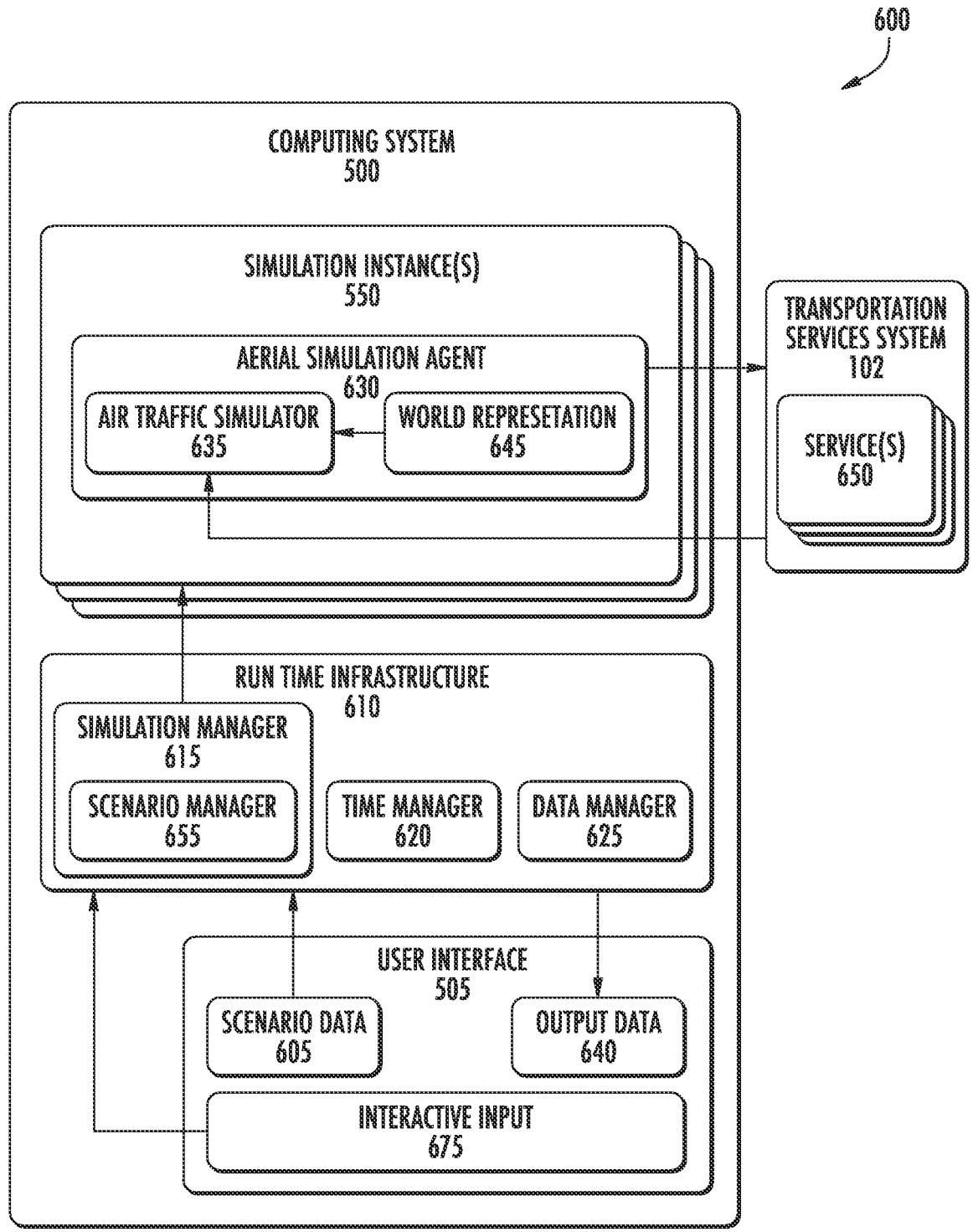
FIG. 6 depicts an example simulation instance architecture according to example implementations of the present disclosure.

By way of example, FIG. 6 depicts an example simulation instance architecture 600 according to example implementations of the present disclosure. The simulation computing system 500 can generate one or more simulation instances 550 based on scenario data 605. The scenario data 605 can include one or more of a list of simulation agents to instantiate, activation behavior of each agent, termination behavior of each agent, a scenario identifier, time management data, environment data (e.g., a simulated world environment, one or more weather conditions as indicated by the list of simulation agents, etc.), integration data, evaluation data, a simulation start time, and/or a simulation time duration. The simulation computing system 500 can generate the simulation instance(s) 550 based on predetermined scenario data 605 (e.g., as indicated by a scenario identifier). In addition, or alternatively, the simulation computing system can generate the simulation instance(s) 550 based on input data indicative of one or more aspects of a simulation scenario. The input data, for example, can include scenario data 605 input (e.g., from a human user, human test operator, etc.) via a user interface 505 of the simulation computing system 500. The simulation computing system 500 can be configured to run a plurality of simulation instances 550 at the same time. The simulation instance 550 can be run based on the same scenario data and/or different sets of scenario data (e.g., defining different scenarios for one or more simulations).

Each simulation instance 550 can be instantiated by a run time infrastructure 610. The run-time infrastructure 610 can include a simulation manager 615, a scenario manager 655 of the simulation manager 615, time manager 620, and/or data distribution 625. The simulation manager 615, for example, can instantiate each of a list of simulation agents identified for one or more of a plurality of simulation instances 550. For example, each simulation instance can be instantiated by a scenario manager 655 based on scenario data 605 defining the simulation instance. For example, the scenario manager 655 can instantiate each simulation instance in the list of simulation agents identified by the scenario data 605. For instance, the list of simulation agents can include an aerial simulation agent 630. In such a case, the scenario manager 655 can instantiate the aerial simulation agent 630. The simulation manager 615 can be a separate layer that controls the state of each component (e.g., agents, etc.) of the simulation instance 550 and controls the execution flow of the simulation instance 550. The simulation manager 615 can handle the configuration of each service 650 and can turn each service 650 on and off, for example, depending on integration data for a scenario. In addition, the simulation manager 615 can start and stop a simulation instance 550 at one or more time steps during the simulation instance 550.

The time manager 620 can include a simulation clock. The simulation clock can be configured to start at a start time and increment at a frequency specified by the scenario data. The frequency, for example, can determine the length of each of a plurality of time steps within a duration of a simulation instance 550. While a simulation instance 550 is running, agents instantiated within the simulation instance and services 650 interacting with agents within the simulation instance 550 can call the time manager 620 to determine a simulation time. The time manager 620 can be a separate layer from the simulation instance 550 that allows the simulation clock to follow a real time clock (e.g., wall clock) to run real-time simulations. In addition, or alternatively, the simulation clock can be faster (and/or slower) than the real time clock (e.g., wall clock) to conduct fast-time simulations.

An agent instantiated within a simulation instance 550 such as, for example, aerial simulation agent 630 can include and/or be associated with a simulated world environment 645 and a behavioral engine such as air traffic simulator 635. For instance, the aerial simulation agent 630 can be initialized within a simulated world environment 645 such that one or more attributes of the aerial simulation agent 630 are derived from the simulated world environment 645 and/or one or more environment variables thereof. The air traffic simulator 635 can determine one or more behaviors of the simulation agent 630 within the simulation instance. For example, the air traffic simulator 635 can be a separate layer such that the simulator 635 can "fly" the aerial simulation agent 630 using trajectory generation capabilities which can be different from trajectory prediction capabilities.

The simulation computing system 500 can include the user interface 505 configured to interact with one or more users of the simulation computing system 500. The user interface 505, for example, can enable a user of the computing system 500 to start and/or end simulation instances 550. The user interface 505 can include one or more input interfaces configured to receive scenario data and/or other data associated with a simulation instance 550. In some implementations, the user interface 505 can include one or more output interfaces configured to provide output data

640. The output data 640, for example, can include evaluation data determined by the data manager 625.

In some implementations, the user interface 505 can receive interactive input 675 (e.g., from the one or more users) during runtime of a simulation instance 550. As described herein, the interactive input 675 can be indicative of one or more desired actions for a simulation agent (e.g., aerial simulation agent 630, etc.). For instance, the interactive input 675 can include one or more agent commands for modifying the behavior (e.g., as defined by behavior engine described herein) of an agent (e.g., aerial simulation agent 630, simulation entity agent(s) 515, simulation world agent(s) 520, etc.) within a simulation instance 550. By way of example, the interactive input 675 can include instructions to cause aerial simulation agent 630 to make one or more functional calls (e.g., to reroute, request a landing procedure, etc.) to the transportation service(s) system 102 (and/or one or more service(s) 650 thereof).

Figure 7:
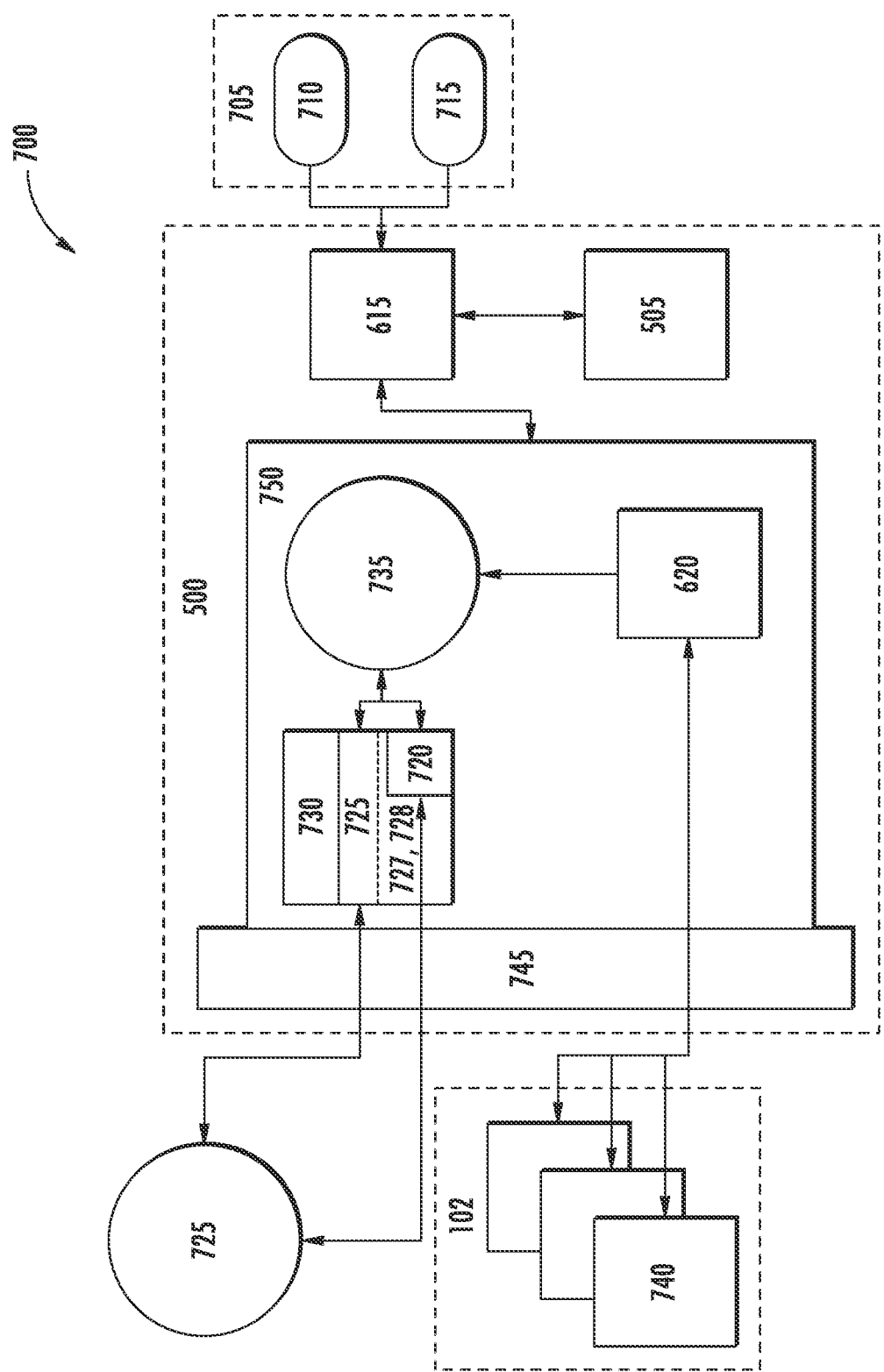
FIG. 7 depicts an example simulation instance model according to example implementations of the present disclosure.

FIG. 7 depicts an example simulation instance model 700 according to example implementations of the present disclosure. The simulation instance model 700 can include a simulation manager 615 configured to interface with a user interface 505 and receive scenario definition data 710 and evaluation/configuration data 715 (e.g., via the user interface 505 and/or any other device). The simulation manager 615 can generate, instantiate, and run a simulation instance 750 including a simulated world environment 735 (e.g., a simulated world environment 530 of FIG. 5), one or more simulation agents 725, 730 (e.g., one or more of simulation entity agents 515 and/or simulation world agents 520 of FIG. 5), and a time manager 620 (e.g., an internal clock defining the frequency of the simulation instance 750). The simulation agents 725, 730 can include simulation entity agents 715. The simulation entity agents can include a behavioral engine defined by an air traffic simulator interface 720. The air traffic simulator interface 720 can interact, through an integration layer 745 defining the boundary of the simulation instance 750, with a trajectory prediction library 725 to determine one or more behaviors of one or more simulation entity agents 725. By way of example, the integration layer 745 can define the boundary of the simulation instance 750 such that the trajectory prediction library 725 and permitted services 740 of the transportations services system 102 can be outside of the simulation instance 750. As described herein, the simulation agents 725, 730 of the simulation instance 750 can interact, through the integration layer 745 and via the time manager 620, with one or more permitted services 740 of a transportation service system 102.

More specifically, the simulation computing system 500 can obtain (e.g., via the user interface 505) input data 705 associated with a simulation instance 750. The input data 705 for example, can include one or more scenario parameters. The one or more scenario parameters can include scenario definition data 710 indicative of one or more simulated agent parameters, one or more testing environment parameters, one or more timing parameters, and/or any other parameter associated with a simulation instance 750. In addition, the one or more scenario parameters can include evaluation/configuration data 715 indicative of one or more evaluation parameters, one or more integration parameters, and/or any other parameter associated with the evaluation of a transportation service and/or one or more services of the transportation services system 102.

In some implementations, each of a plurality of simulation agents of an agent database (e.g., simulation agents 515 of FIG. 5) and a plurality of simulated world environments of a world database (e.g., simulated world environments 530 of FIG. 5) can include a corresponding unique identifier. In such a case, the simulated agent parameter(s) can include a respective unique identifier for at least one simulation agent 725, 730 of the agent database. In addition, the one or more testing environment parameters can include another respective unique identifier for at least one simulated world environment 735 of the world database. By way of example, the at least one simulation agent can include a simulation aerial vehicle agent 727. In addition, or alternatively, the at least one simulation agent can include one or more secondary simulated aerial vehicle agents 728, one or more other simulation entity agents 725 (e.g., air traffic controller agents, passenger agents, etc.), and/or one or more world agents 730.

The simulation computing system 500 can obtain (e.g., via the agent database) scenario agent data for the simulation instance 750. For example, the simulation computing system 500 can obtain the scenario agent data based on the one or more simulation agent parameters of the input data 705. By way of example, each of the one or more simulated agent parameters can identify (e.g., via a unique identifier, an agent type, etc.) at least one simulated agent 725, 730 of the plurality of simulation agents (e.g., agents 515, 520) of the agent database. In some implementations, the scenario agent data can be indicative of a simulation aerial vehicle 727. The simulation aerial vehicle 727, for example, can include one of the plurality of simulation agents (e.g., agents 515, 520) of the agent database. In addition, or alternatively, the scenario agent data can be indicative of one or more secondary simulated aerial vehicle agents 728 of the plurality of simulated aerial vehicle agents (e.g., agents 515, 520), one or more other simulation entity agents 725 (e.g., air traffic controller agents, passenger agents, etc.), and/or one or more world agents 730.

The simulation computing system 500 can obtain (e.g., via the world database) scenario world data. For example, the simulation computing system 500 can obtain, via the world database, the world data based, at least in part, on the one or more testing environment parameters of the input data 705. The one or more testing environment parameters, for example, can identify at least one simulated world environment 735 of the plurality of simulated world environments (e.g., simulated world environments 520 of FIG. 5). The scenario world data can be indicative of the at least one simulated world environment 735 of the plurality of simulated world environments. For example, the scenario world data can include a plurality of environment variables at each time step (e.g., as defined by the time manager 620) associated with the at least one simulated world environment 735. As discussed herein, the simulated world environment 735 can represent a real-world environment. For example, the simulated world environment 735 can be based, at least in part, on real world data indicative of a prerecorded real world environment.

In addition, or alternatively, the simulation computing system 500 can obtain integration data, for example, based on the input data 705. The integration data can be indicative of the one or more backend services 740 of the transportation services system 102. For example, the input data 705 can include one or more integration parameters indicative of one or more services 740 of the transportation services system 102. The integration data can be based on the one or more integration parameters of the input data 705. The one or more backend services 740 identified by the integration data can include one or more permitted services 740 of the transportation services system 102 as indicated by an access permission. For example, as discussed herein, one or more of the simulation entity agents 725 (e.g., aerial vehicle agents 727, 728, air traffic control agents, etc.) can typically have access to one or more backend services of the transportation services system 102 (e.g., as defined by a behavioral engine such as air traffic simulator interface 720). The integration parameters can indicate which of the backend services (e.g., services 740) will be available to an agent (e.g., aerial vehicle agents 727, 728) during the simulation instance 750.

In some implementations, the simulation computing system 500 can modify the access of one or more of the simulation entity agents 725 based, at least in part, on the integration data. For example, the simulation computing system 500 can determine an access permission for a simulated agent (e.g., the simulated aerial vehicle 727 and/or one or more other simulation entity agents 725 identified by the input data 705 (e.g., secondary aerial vehicle agents 728, etc.)) based, at least in part, on the integration data. An access permission, for example, can classify a service of the transportation services system 102 as in-the-loop and/or out-of-the-loop for a respective simulation agent. A service that is classified as in-the-loop can be accessible to the respective simulation agent. A service that is classified as out-of-the-loop can be inaccessible to the respective simulation agent. In some implementations, the transportation services system 102 can be classified as out-of-the-loop for a respective simulation instance. In such a case, each service provided by the transportation services system 102 can be out-of-the-loop for the respective simulation instance.

The simulation computing system 500 can determine an access permission for each simulation agent 725, 730 identified by the input data 705. During the simulation instance 750, the simulation computing system 500 can facilitate (e.g., via a simulation moderation agent) functional calls to permitted services 740 of the transportation services system 102 made by each of the simulation agents 725, 730 based on the access permission associated with each simulation agent. A functional call can be forwarded in the event that a respective access permission identifies the called service as in-the-loop for the respective simulation agent. In the event that the called service is out-of-the-loop, the simulation computing system 500 (e.g., a simulation moderation agent) can forward the call to a simulated mocked service. The simulated mocked service can return simulated returned data (e.g., a default value) in response to the function call.

In some implementations, the simulation computing system 500 can obtain at least one evaluation parameter indicative of one or more testing metrics. For example, the input data 705 can include the at least one evaluation parameter (e.g., allowing a user/test operator to customize the evaluated factors of a simulation). The evaluation parameter can identify one or more testing metrics for testing one or more aspects of a transportation service and/or the transportation services system. For example, an evaluation parameter can identify a testing metric to test a simulation aerial vehicle's 727, 728 ability to access one or more services 740 of the transportation services system 102, a testing metric to test the performance of one or more services 740 of the transportation services system 102 under one or more transportation and/or environmental conditions, a testing metric to measure a noise level generated by a transportation service, and/or any other testing metric to evaluate the performance of the transportation services system 102 and/or the viability of one or more transportation service scenarios (e.g., transportation over urban areas with noise constraints).

The simulation computing system 500 can obtain timing data including at least one timing parameter indicative of a simulation frequency for the simulation scenario. The simulation frequency can be indicative of real time and/or one or more modified times (e.g., an accelerated time, a decelerated time, etc.). For example, a simulation frequency indicative of real time can include a simulated time step of one second at each second of real time. In addition, or alternatively, the simulation frequency can be indicative of one or more modified times. A simulation frequency indicative of a modified time can include a modified number of one second time steps for each second of real time. By way of example, a simulation frequency indicative of an accelerated simulation time can include one or more one time steps of a second for each second of real time. As an example, an accelerated simulation frequency can include two or more second long time steps for each second of real time. As discussed herein, the simulated world environment 735 and/or the services 740 of the transportation services system 102 can be configured to iterate through one or more time steps defined by the simulation frequency during a simulation instance 750.

The simulation computing system 500 can determine scenario data indicative of a simulation scenario based on the input data 705. For example, the scenario data can be based, at least in part, on the scenario agent data, the scenario world data, the integration data, the one or more evaluation parameters, the timing data, and/or any other data relevant to a real world transportation service. The scenario data can include a scenario definition defining one or more scenario parameters for the simulation scenario. The scenario definition can include all information for instantiating the simulation instance 750. For example, as discussed herein, a simulation scenario can include a plurality of scenario parameters including a list of simulation agents (e.g., indicated by the agent data), an activation behavior and termination behavior (e.g., defined by the agent definition associated with each agent and/or modified by the input data 705), time management data for a time manager 620 (e.g., indicated by the timing data), environment options (e.g., as indicated by the agent data and/or the world data), integration data (e.g., indicated by the input data 705), evaluation data (e.g., indicated by the evaluation parameters of the input data 705), a simulation start time, and/or a simulation time duration. The simulation start time and/or simulation time duration, for example, can be identified by the input data 705 or can be a default simulation start time and/or time duration.

In the event any scenario parameters are not identified by the input data 705 and/or the scenario definition (e.g., as provided by the scenario data), the simulation computing system 500 can use one or more default parameters. For instance, a default start time can include a current real time, a default time duration can include one or more hours, a simulation frequency can include a real time frequency (e.g., one second time step per real time second), a default environment option can include no weather (e.g., no environment agents), default integration data can identify each service of the transportation services system 102 as in-the-loop for each agent 725, 730 of the scenario, default evaluation data can include no data collection, etc. Each of the scenario parameters can be specified before the initialization of a simulation instance 750 based on the simulation scenario. In this manner, if not specified by the scenario definition, the default value for a respective parameter can be used for a simulation instance 750.

The simulation computing system 500 can generate a first simulation instance 750 for the simulation scenario based, at least in part, on the scenario data. The simulation instance 750 can be generated in accordance with the scenario definition as provided for by the scenario data. The simulation instance 750 can include the simulated aerial vehicle 727 and/or one or more other agents 725, 730 within the simulated world environment 735. For example, the simulation instance 750 can include one or more secondary simulated aerial vehicle agents 728 and/or one or more environment agents (e.g., one or more of world agents 730) within the simulated world environment 735 as identified by the scenario definition.

Each of the simulation agents 725, 730 can be generated relative to the simulated world environment 735. For instance, the simulation computing system 500 can generate an instance of each simulation agent 725, 730 with attributes localized within the simulated world environment 735. By way of example, the aerial vehicle agent 727 can be generated with an initial position relative to the simulated world environment 735. In addition, an environment agent 730 can be generated with a wind speed, noise level, etc. at one or more locations and times relative to the simulated world environment 735. In this manner, the attributes of each simulation agent 725, 730 can be anchored within the simulated world environment 735.

The simulation computing system 500 can facilitate access between one or more of the simulation agents 725, 730 and the one or more backend services 740 of the transportation services system 102 based on the integration data and the behavioral engine (e.g., the air traffic simulator interface 720 for aerial vehicle agents 727, 728) for each agent 725, 730. For instance, the simulated aerial vehicle 727 and/or the one or more secondary simulated aerial vehicle agents 728 can be configured to access the one or more backend services 740 of the transportation services system 102 via the application programming interface platform having one or more functional calls to the one or more backend services 740 of the transportation services system 102. For example, the behavioral engine (e.g., air traffic simulator interface 720) for the simulated aerial vehicle 727 and/or the one or more secondary simulated aerial vehicle agents 728 can include one or more function calls at one or more times steps of the simulation instance 750 to the backend service(s) 740 of the transportation services system 102. The simulation computing system 500 can receive a function call and facilitate each agent's (e.g., the simulated aerial vehicle 727) access to the one or more backend services 740 based, at least in part, on the access permission. In this manner, the simulated aerial vehicle 727 and/or the one or more secondary simulated aerial vehicle agents 728 can have access, through the integration layer 745, to the one or more backend services 740 of the transportation services system 102 outside of the simulation instance 750 during the simulation instance 750 (e.g., if permitted).

The simulation computing system 500 can initiate the simulation instance 750 by running the simulation instance 750 over one or more time steps defined by the time manager 620. For example, the simulation instance 750 can be run over a simulation duration of the simulation instance 750. The simulation duration of the simulation instance can be defined as the earlier of either the instance at which a time duration specified by the scenario definition has passed and/or the instance at which the last entity agent 725 has terminated (e.g., the aerial vehicle agent 727, one or more secondary vehicle agents 728, etc.). Unless specified otherwise by the scenario definition, each entity agent 725 can terminate according to the termination behavior of the agent definition corresponding to the respective agent.

Upon initiation, the simulation computing system 500 can initiate each respective simulation agent 725, 730 within the simulated world environment 735 based on the respective activation behavior of the simulation agents 725, 730. For example, unless specified otherwise by the scenario definition, each agent can be initiated according to the activation behavior of the agent definition corresponding to the respective agent. During the simulation instance 750, the aerial vehicle agent 727 (and/or any other simulation entity agent 725, 730) can interact with the transportation services system 102 to obtain a transportation service assignment. In the event that the integration data prohibits interaction with the transportation services system 102 (e.g., the transportation services system 102 is out-of-the-loop), the simulation computing system 500 can determine a transportation service assignment for the aerial vehicle agent 727 (and/or any other simulation entity agent 725) beginning at a departure time. The departure time, for example, can be determined relative to a simulation start time for the simulation instance 750.

The simulation duration can be referenced against a simulation clock maintained by the time manager 620. The simulation clock, for example, can begin at the start time and step through time at the frequency defined by the scenario definition (e.g., timing data of the scenario data). The simulation start time can be internally consistent (e.g., not derived from an external clock). In the event that the integration data permits interaction with the transportation services system 102 (e.g., the transportation services system 102 is in-the-loop), the transportation services system 102 can reference the simulation clock of the time manager 620 to determine a time for a function call to the transportation services system 102 from an entity agent 725 during the instantiated simulated instance 750.

The simulation computing system 500 (e.g., the simulation manager 615) can be responsible for the initialization, commencement, and destruction of the simulation instance 750. The simulation instance 750 can be commenced by starting the simulation clock of the time manager 620. For instance, the simulation computing system 500 can trigger the commencement of time. The commencement of time can be automatic (e.g., upon initiation) and/or manually triggered. Upon simulation completion, the simulation computing system 500 can destruct the simulation instance 750 gracefully. For instance, a graceful closure can include saving data collected (e.g., the evaluation data, etc.) during the simulation instance 750 in one or more databases (e.g., evaluation database, etc.). The simulation computing system 500 (e.g., the simulation manager 615) can manually destruct the simulation instance 750 at any time during the simulation duration. In addition, or alternatively, the simulation computing system 500 (e.g., the simulation manager 615) can automatically destruct the simulation instance 750 upon completion of the simulation instance 715.

The simulation instance 750 can maintain a reference, via the time manager 620, to a simulation time. The simulation time can be defined by an anchor instance and a simulation frequency. In some implementations, the clock anchor can include epoch 0-00:00:00 UTC on 1 Jan. 1970. The clock anchor can be used in conjunction with the start time (e.g., the start time included in the scenario definition). The time manager 620 can increment the simulation time based on the simulation frequency (e.g., as indicated by the timing parameter of the scenario data). Unless otherwise specified, the simulation frequency can include real time. At the beginning of each simulation agent's behavioral loop (e.g., as defined by a respective behavioral engine of the agent), the simulation agent can update its internal state based on the present simulation time from the simulation time as indicated by the simulation clock. In this manner, the simulation instance 750 (e.g., one or more simulated agents 715, 730 of the simulation instance 750) can iterate through one or more time steps defined by the simulation frequency.

The simulation instance can enable the interaction between each initialized simulation agent 725, 730 within the simulated world environment 735 at one or more timesteps of the simulation duration. For example, the behavioral engine (e.g., air traffic simulator interface 720) for the aerial vehicle agent 727 (and/or any other of the agents 725, 730 initialized within the simulated world environment 735) can include a communication to one or more other simulated agents 725, 730 within the simulated world environment 735. The aerial vehicle agent 727 (and/or any of the other agents 725, 730 initialized within the simulated world environment 735) can have the ability to provide a request to another agent 725, 730 for information such as, for example, a surrounding traffic at a location within the simulated world environment 735, a noise level caused by the agent, etc. In addition, the aerial vehicle agent 727 (and/or any of the other agents 725, 730 initialized within the simulated world environment 735) can have the ability to receive (e.g., in response to the request) information from another agent 725, 703 and update its attributes accordingly.

Figure 8:
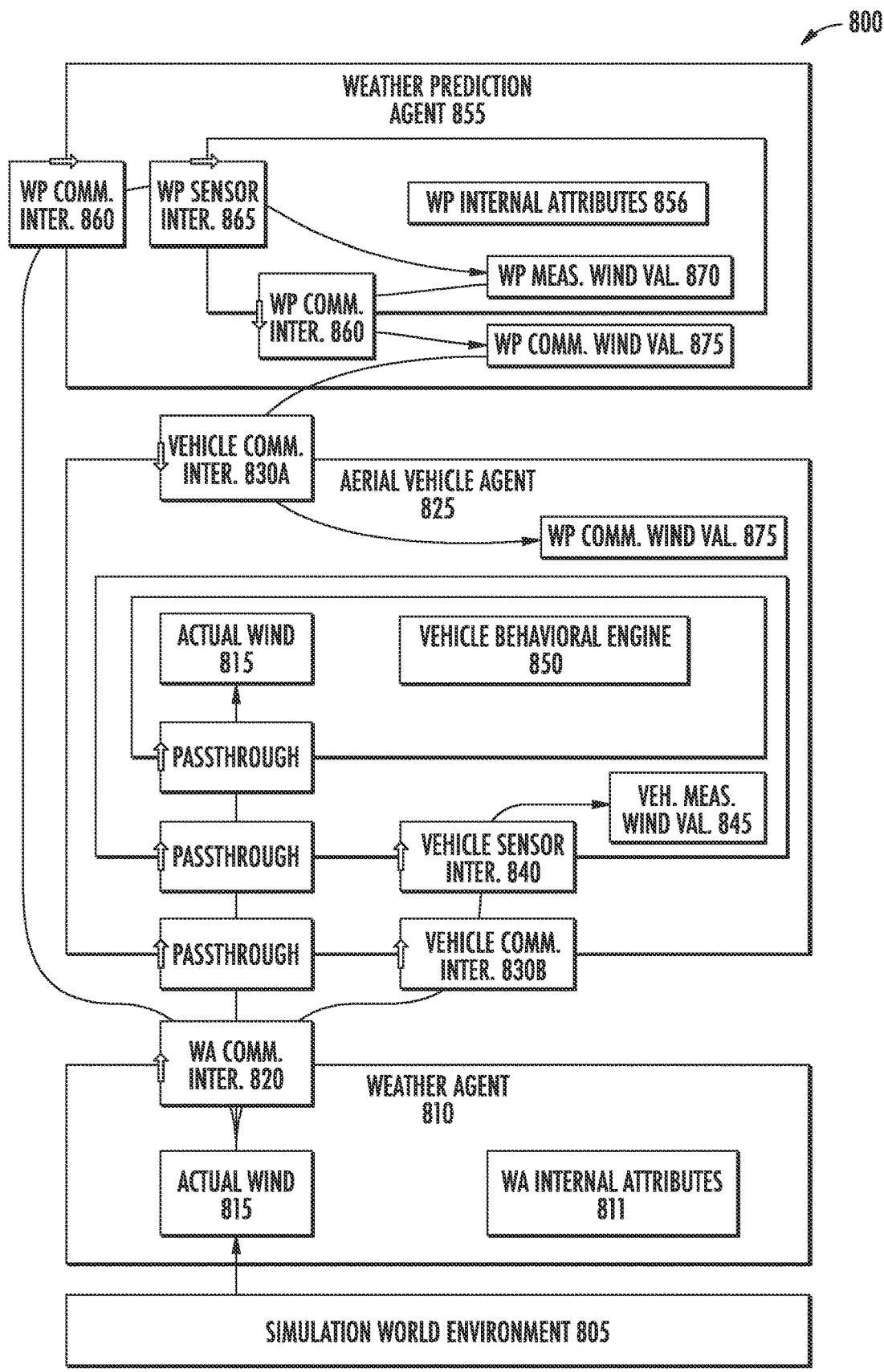
FIG. 8 depicts example communications between agents of a simulation instance according to aspects of the present disclosure.

By way of example, FIG. 8 depicts interactions between agents of a simulation instance 800. As illustrated, a simulation instance 800 can include an interaction between a simulation entity agent such as aerial vehicle agent 825 and two world agents such as a weather prediction agent 855 and a weather environment agent 810. The weather environment agent 810 can be associated with a wind value 815. For example, one or more internal attributes 811 of the weather agent can include one or more wind values. The wind value 815 can include an actual value (e.g., as indicated by the simulated world environment 805) of a wind speed, direction, etc. at one or more locations and time defined by the simulation instance 750. Although the wind value 815 is depicted as, and referred to herein as actual wind 815, it should be appreciated that the actual wind 815 could be measured wind (e.g., as measured by the sensor interface of the weather agent 810), a communicated wind value (e.g., as communicated by the communication interface 820 of the weather agent), and/or any other value illustrative to the wind attribute as perceived by the weather environment agent 810 during the simulation instance 810.

The weather prediction agent 855 can be configured to simulate the behavior of a weather station. For instance, the internal attributes 856 of the weather prediction agent 855 can model attributes of one or more weather stations in the real world. The weather prediction agent 855 can receive the actual wind 815 via a weather prediction communication interface 860. In some implementations, the weather prediction communication interface 860 can allow the actual wind value 815 to pass through unaffected to the sensor interface 865 of the weather prediction agent 855. The weather prediction agent 855 can determine a weather prediction measured wind value 870 based, at least in part, on the actual wind value 815. The weather prediction measured wind value 870 can simulate a measure of wind by one or more sensors of a real world weather prediction agent. For instance, the actual wind value 815 can be filtered through the weather prediction interface 865 (e.g., simulating sensors of a real world weather prediction system) to simulate the actual measurement of wind data. In this respect, the weather prediction agent 855 can filter the weather prediction measured wind value 870 through a weather prediction communication interface 860 to obtain a weather prediction communicated measure wind value 875.

The weather prediction communicated measure wind value 875 can simulate a real world weather station's actual measurement and transmission of wind data.

In this manner, the aerial vehicle agent 825 can receive at least three different values for a wind attribute in response to a request (e.g., via the behavior engine 850) for wind information. For instance, the behavior engine 850 can receive the actual wind 815 from the weather agent 820 unaffected by the vehicle communication interface 830B or the vehicle sensor interface 840. In addition, the aerial vehicle agent 855 can receive a vehicle measured wind value 845 based on a measurement of the actual wind 815 by the vehicle sensor interface 840 of the aerial vehicle agent 825. The vehicle sensor interface 840 can model one or more sensors available on a real world vehicle such that the vehicle measure wind value 845 can simulate the perception of wind for an aerial vehicle in the real world.

In addition, the aerial vehicle agent 825 can request a wind prediction from the weather prediction agent 855. In such a case, the weather prediction agent 855 can provide the weather prediction communicated wind value 875 to the aerial vehicle agent 825. The weather prediction communicated wind value 875 can be logically filtered through the weather prediction agent's outbound communication interface 855 and/or the aerial vehicle agent's inbound communication interface 830A. Upon receipt, the weather prediction communicated wind value 875 can include a simulation attribute, since it does not represent a property of an actual aircraft. For example, the actual simulated properties of the actual aircraft can be represented by the actual wind 815. The simulation properties (e.g., perceived properties) of the aerial vehicle agent 825 can include the weather prediction communicated wind value 875 and/or the vehicle measure wind value 845. In this manner, a simulation instance 800 can detect issues with a transportation service as granular as the effectiveness of vehicle sensors and/or the transmission of data.

Each agent in a simulation instance such as instance 800 can update its internal attributes (e.g., weather prediction attributes 856, weather agent attributes 811, attributes of the vehicle behavior engine 850, etc.) by following a one or more rules for updating a respective attribute. For instance, static agent attributes (e.g., agent identifier, etc.) can be written to once during (or post) initialization by the simulation computing system. Internal attributes (e.g., attributes defined by the behavioral engine) can be read and written to by a respective behavioral engine (e.g., vehicle behavioral engine 850). In some implementations, such privilege can be restricted to the respective behavioral engine. Attributes determined by one or more interfaces (e.g., sensor interface(s) 840, 865, communication interface(s) 820, 830A, B, 860, etc.) of a respective agent can be read and written to by the respective agent (e.g., and not communicated to other agents). An entity agent (e.g., aerial vehicle agent 825) can read simulated attributes from a world agent (e.g., weather agent 810) (e.g., directly and/or through a respective sensor and/or communication interface of the entity agent and/or world agent). The behavioral engine of a world agent can be configured to read other agents' attributes (e.g., bypassing one or more communication modules), for example, to determine a position and/or other information for the other agents.

Entity agents (e.g., the aerial vehicle agent 825, etc.) can compare communicated information to other information perceived by the entity agent. For example, a respective entity agent's simulated natural values (e.g., the actual wind 815, a location, etc. as represented by the simulated world environment 805) can be read through the respective sensor interface (e.g., vehicle sensor interface 840) of the respective entity agent and a corresponding simulated measured value (e.g., vehicle measured value 845) (e.g., the agent's perception of the actual wind 815, its actual location, etc. as defined by simulated sensors of the agent) can be written, by the sensor interface (e.g., vehicle sensor interface 840), to the behavioral engine (e.g., vehicle behavioral engine 850) of the respective entity agent. An entity agent's respective measured value can be read by one or more other respective entity agents through a respective communications interface (e.g., vehicle communication interface(s) 830A, B) associated with each of the one or more other respective entity agents. For instance, an entity agent's simulated communicated values (e.g., the location as communicated by the agent) can be readable by other entity agents and written through a respective communications interface of the entity agent.

An entity agent can update its attributes based on the type of attribute received. For instance, the entity agent can update an attribute based on a simulated natural value in favor of a measured value and a communicated value. In addition, the entity agent can update an attribute based on a measured value in favor of a communicated value. By way of example, the behavioral engine of respective agent can update a location attribute based on the simulated natural value of the agent's location. In this manner, the behavioral engine simulating the behavior of a simulation entity can predict realist actions based on the simulation entities actual location within the simulated world environment. As another example, the respective agent can communicate a communicated value for a location to another agent within the simulation instance. In some implementations, the communicated value of the location can be different from the actual value for the location. Thus, by communicating the communicated value a simulation instance can simulate data loss and/or corruption through one or more communication channels.

Turning back to FIG. 6, the simulation computing system 500 can generate and initiate a first simulation instance with one or more interactive agents based on the scenario data as discussed herein. In some implementations, the simulation computing system 500 can generate and initiate a plurality of simulation instances 550. For example, in some implementations, the simulation computing system 500 can generate, initiate, commence, and/or destruct one or more second simulation instances based on the scenario definition of the first simulation instance and/or one or more other scenario definitions. Each simulation instance 550 can be generated, initiated, commenced, and/or destructed independent of every other instance. For example, each simulation instance 550 can include a segregated simulation instance state at each respective time step of a respective simulation duration as defined by a respective time manager 620. In this manner, a performance degradation in one simulation instance will not impact the performance of other active instances.

The simulation computing system 500 (e.g., the data manager 625) can determine evaluation data (e.g., output data 640) for one or more of the one or more time steps (e.g., defined by the time manager 620) based on the plurality of simulation instances 550. For example, the simulation computing system 500 can determine evaluation data associated with the first simulation instance for at least one of the one or more time steps of the first simulation duration based on one or more testing metrics identified by the at least one evaluation parameter of the scenario definition. The evaluation data, for instance, can be indicative of a configuration success and/or failure rate between one or more services 650 of the transportation services system 102 and/or one or more simulation agents (e.g., aerial simulation agent 630) (e.g., a third party aerial vehicle agent, etc.). As another example, the evaluation data can be indicative of one or more environment conditions caused by a transportation service such as, for example, an air space congestion, a noise level, etc. In this manner, the simulation computing system 500 can help verify that vehicles (e.g., third-party autonomous vehicles, etc.) are able to fully utilize the backend services 650 (e.g., system clients) of the transportation services system 102 as well as complete service assignments of the service entity through one or more simulation instances.

In some implementations, the simulation computing system 500 can be configured to obtain evaluation data at each time step of the one or more time steps. By way of example, a simulation instance can include a simulation state for each time step of the simulation instance. The simulation state can include the scenario definition, the time step and defined frequency, the environment variables at the time step, the agent state (e.g., agent attributes, predicted future behavior, etc.) of each of the simulated agents initiated within the simulation instance at the time step, an integration status (e.g., whether one or more services of the transportation services system are in-the-loop or out-of-the-loop), and/or a data collection state (e.g., one or more testing metrics for the simulation instance as defined by the data manager 625), etc. In some implementations, the simulation computing system 500 (e.g., the data manager 625) can obtain evaluation data including the simulation state at each time step of the simulation instance. The simulation computing system 500 can output, via the user interface, the output data 640 including the evaluation data to the one or more users of the simulation computing system 500 and/or store the evaluation data in one or more databases such as, for example, the evaluation database.

Figure 9:
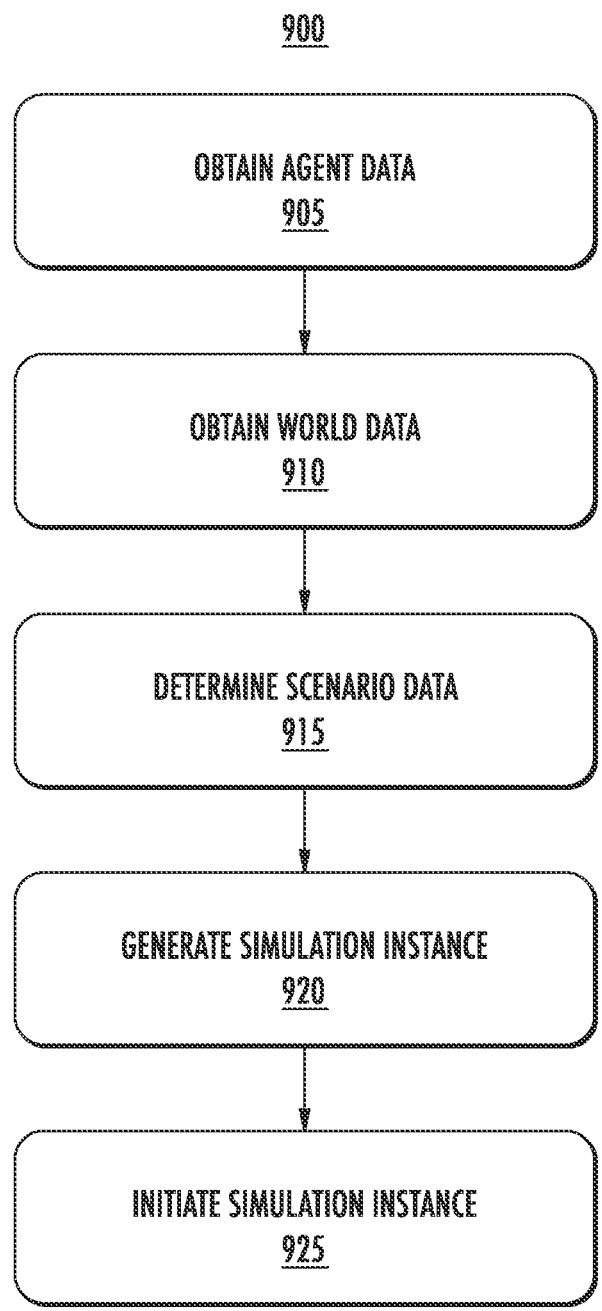
FIG. 9 depicts a flowchart of a method for simulating a transportation service according to aspects of the present disclosure.

Turning to FIG. 9, FIG. 9 depicts a flowchart of a method 900 for simulating a transportation service according to aspects of the present disclosure. One or more portion(s) of the method 900 can be implemented by a computing system that includes one or more computing devices such as, for example, the computing systems described with reference to the other figures (e.g., system 100, transportation services system 102, simulation computing system 500, simulation computing devices 195, etc.). Each respective portion of the method 900 can be performed by any (or any combination) of one or more computing devices. Moreover, one or more portion(s) of the method 900 can be implemented as an algorithm on the hardware components of the device(s) described herein (e.g., as in FIGS. 1, 5-8, 10, etc.), for example, to simulate a transportation service. FIG. 9 depicts elements performed in a particular order for purposes of illustration and discussion. Those of ordinary skill in the art, using the disclosures provided herein, will understand that the elements of any of the methods discussed herein can be adapted, rearranged, expanded, omitted, combined, and/or modified in various ways without deviating from the scope of the present disclosure. FIG. 9 is described with reference to elements/terms described with respect to other systems and figures for exemplary illustrated purposes and is not meant to be limiting. One or more portions of method 900 can be performed additionally, or alternatively, by other systems.

At 905, the method 900 can include obtaining agent data. For example, a computing system (e.g., system 100, transportation services system 102, simulation computing system

500, simulation computing devices 195, etc.) can obtain agent data indicative of a simulation aerial vehicle. For instance, the agent data can be obtained via an agent database. The agent data can include an agent definition for the simulation aerial vehicle. The agent definition, for example, can include a sensor interface configured to determine one or more measured values based, at least in part, on at least one of the plurality of environment variables, a communications interface configured to communicate data within the simulated world environment, and/or a behavioral engine that defines one or more dynamic behaviors of the simulation aerial vehicle. The one or more dynamic behaviors, for example, of the simulation aerial vehicle can be defined based, at least in part, on a predicted behavior for an aerial vehicle corresponding to the simulation aerial vehicle.

For example, the agent database can include agent data indicative of a plurality of simulation agents. The plurality of simulation agents can include a plurality of aerial vehicle agents and a plurality of world agents. Each of the plurality of simulation agents can be predetermined based on real world data. The simulation aerial vehicle can include one of the plurality of aerial vehicle agents that is based on a corresponding real world aerial vehicle. In some implementations, the scenario agent data can be indicative of one or more secondary simulation aerial vehicle agents and one or more world agents each corresponding to another real world entity and/or world condition.

In some implementations, the computing system can include a user interface configured to interact with one or more users of the computing system. In such a case, the computing system can obtain, via the user interface, input data including one or more scenario parameters. The one or more scenario parameters can include one or more simulation agent parameters and one or more testing environment parameters. The computing system can obtain, via the agent database, the agent data based, at least in part, on the one or more simulation agent parameters. For example, each of the one or more simulation agent parameters can identify at least one simulation agent of the plurality of simulation agents.

At 910, the method 900 can include obtaining world data. For example, a computing system (e.g., system 100, transportation services system 102, simulation computing system 500, simulation computing devices 195, etc.) can obtain world data indicative of a simulated world environment. For instance, the world data can be obtained via a world database. For example, the computing system can obtain, via the world database, the world data based, at least in part, on the one or more testing environment parameters. Each of the one or more testing environment parameters can identify at least one simulated world environment of the plurality of simulated world environments. By way of example, each of the plurality of simulation agents and the plurality of simulated world environments can include a corresponding unique identifier. The one or more simulation agent parameters can include a respective unique identifier for the at least one simulation agent and the one or more testing environment parameters can include another respective unique identifier for the at least one simulated world environment. The world data can include a plurality of environment variables for each time step of one or more time steps.

At 915, the method 900 can include determining scenario data. For example, a computing system (e.g., system 100, transportation services system 102, simulation computing system 500, simulation computing devices 195, etc.) can determine scenario data indicative of a simulation scenario based, at least in part, on the agent data and the world data. In addition, the computing system can obtain integration data indicative of the one or more backend services of the transportation services system and determine an access permission for the simulation aerial vehicle based, at least in part, on the integration data. In some implementations, the computing system can obtain at least one timing parameter indicative of a simulation frequency for the simulation scenario. In addition, or alternatively, the computing system can obtain at least one evaluation parameter indicative of one or more testing metrics. The scenario data can be indicative of the at least one timing parameter and the at least on evaluation parameter.

At 920, the method 900 can include generating a simulation instance. For example, a computing system (e.g., system 100, transportation services system 102, simulation computing system 500, simulation computing devices 195, etc.) can generate a simulation instance for the simulation scenario based, at least in part, on the scenario data. The simulation instance can include the simulation aerial vehicle within the simulated world environment. The simulation aerial vehicle can have access to one or more backend services of a transportation services system configured to facilitate an aerial transportation service. The simulation aerial vehicle can be configured to access the one or more backend services of the transportation services system during the simulation instance via an application programming interface platform having one or more functional calls to the one or more backend services of the transportation services system.

For instance, the simulation aerial vehicle can have access to the one or more backend services based, at least in part, on the access permission for the aerial vehicle. By way of example, the transportation services system can include a plurality of backend services. The one or more backend services can include one or more permitted services of the transportation services system as indicated by the access permission. In addition, or alternatively, the simulation instance can include one or more secondary simulation aerial vehicle agents and one or more world agents within the simulated world environment. In such a case, the one or more secondary simulation aerial vehicle agents can have access to the one or more backend services of the transportation services system.

At 925, the method 900 can include initiating a simulation instance. For example, a computing system (e.g., system 100, transportation services system 102, simulation computing system 500, simulation computing devices 195, etc.) can initiate the simulation instance by running the simulation instance over one or more time steps. For instance, the simulated world environment and the transportation services system can be configured to iterate through one or more time steps defined by the simulation frequency. The simulation frequency, for example, can be indicative of real time and the one or more time steps can include a time step for each second of real time. In addition, or alternatively, the simulation frequency can be indicative of an accelerated time and the one or more time steps can include at least two time steps for each second of real time.

In some implementations, the computing system can determine evaluation data associated with the simulation instance for at least one of the one or more time steps based, at least in part, on the one or more testing metrics and/or the simulation instance. In such a case, the computing system can store the evaluation data and/or output, via the user interface, the evaluation data to the one or more users of the computing system.

Moreover, in some implementations, the computing system can generate a second simulation instance for the simulation scenario based, at least in part, on the scenario data and a second start time. The computing system can initiate the second simulation instance by running the second simulation instance over one or more time steps beginning at the second start time.

FIG. 10 depicts example system components of an example system 1000 according to example embodiments of the present disclosure. The example system 1000 can include the computing system 1005 (e.g., a transportation services system 102) and the computing system(s) 1050 (e.g., rider device(s) 140, service provider computing device(s) 150, 160, 170, simulation computing device(s) 195, simulation computing system 500, etc.), etc. that are communicatively coupled over one or more network(s) 1045.

The computing system 1005 can include one or more computing device(s) 1010. The computing device(s) 1010 of the computing system 1005 can include processor(s) 1015 and a memory 1020. The one or more processors 1015 can be any suitable processing device (e.g., a processor core, a microprocessor, an ASIC, a FPGA, a controller, a microcontroller, etc.) and can be one processor or a plurality of processors that are operatively connected. The memory 1020 can include one or more non-transitory computer-readable storage media, such as RAM, ROM, EEPROM, EPROM, one or more memory devices, flash memory devices, etc., and combinations thereof.

The memory 1020 can store information that can be accessed by the one or more processors 1015. For instance, the memory 1020 (e.g., one or more non-transitory computer-readable storage mediums, memory devices) can include computer-readable instructions 1025 that can be executed by the one or more processors 1015. The instructions 1025 can be software written in any suitable programming language or can be implemented in hardware. Additionally, or alternatively, the instructions 1025 can be executed in logically and/or virtually separate threads on processor(s) 1015.

For example, the memory 1020 can store instructions 1025 that when executed by the one or more processors 1015 cause the one or more processors 1015 to perform operations such as any of the operations and functions for which the computing systems (e.g., transportation services system 102, simulation computing system 500) are configured, as described herein.

The memory 1020 can store data 1030 that can be obtained, received, accessed, written, manipulated, created, and/or stored. The data 1030 can include, for instance, agent data, world data, scenario data, and/or other data/information described herein. In some implementations, the computing device(s) 1010 can obtain from and/or store data in one or more memory device(s) that are remote from the computing system 1005 such as one or more memory devices of the computing system 1050.

The computing device(s) 1010 can also include a communication interface 1035 used to communicate with one or more other system(s) (e.g., computing system 1050). The communication interface 1035 can include any circuits, components, software, etc. for communicating via one or more networks (e.g., 1045). In some implementations, the communication interface 1035 can include for example, one or more of a communications controller, receiver, transceiver, transmitter, port, conductors, software and/or hardware for communicating data/information.

The computing system 1050 can include one or more computing devices 1055. The one or more computing devices 1055 can include one or more processors 1060 and a memory 1065. The one or more processors 1060 can be any suitable processing device (e.g., a processor core, a microprocessor, an ASIC, a FPGA, a controller, a microcontroller, etc.) and can be one processor or a plurality of processors that are operatively connected. The memory 1065 can include one or more non-transitory computer-readable storage media, such as RAM, ROM, EEPROM, EPROM, one or more memory devices, flash memory devices, etc., and combinations thereof.

The memory 1065 can store information that can be accessed by the one or more processors 1060. For instance, the memory 1065 (e.g., one or more non-transitory computer-readable storage mediums, memory devices) can store data 1075 that can be obtained, received, accessed, written, manipulated, created, and/or stored. The data 1075 can include, for instance, agent data, world data, scenario data, and/or other data or information described herein. In some implementations, the computing system 1050 can obtain data from one or more memory device(s) that are remote from the computing system 1050.

The memory 1065 can also store computer-readable instructions 1070 that can be executed by the one or more processors 1060. The instructions 1070 can be software written in any suitable programming language or can be implemented in hardware. Additionally, or alternatively, the instructions 1070 can be executed in logically and/or virtually separate threads on processor(s) 1060. For example, the memory 1065 can store instructions 1070 that when executed by the one or more processors 1060 cause the one or more processors 1060 to perform any of the operations and/or functions described herein, including, for example, any of the operations and functions of the devices described herein, and/or other operations and functions.

The computing device(s) 1055 can also include a communication interface 1080 used to communicate with one or more other system(s). The communication interface 1080 can include any circuits, components, software, etc. for communicating via one or more networks (e.g., 1045). In some implementations, the communication interface 1080 can include for example, one or more of a communications controller, receiver, transceiver, transmitter, port, conductors, software and/or hardware for communicating data/information.

The network(s) 1045 can be any type of network or combination of networks that allows for communication between devices. In some embodiments, the network(s) 1045 can include one or more of a local area network, wide area network, the Internet, secure network, cellular network, mesh network, peer-to-peer communication link and/or some combination thereof and can include any number of wired or wireless links. Communication over the network(s) 1045 can be accomplished, for instance, via a network interface using any type of protocol, protection scheme, encoding, format, packaging, etc.

FIG. 10 illustrates one example system 1000 that can be used to implement the present disclosure. Other computing systems can be used as well. Computing tasks discussed herein as being performed at a transportation services system, the simulation computing system, etc. can instead be performed remote from the respective system, or vice versa. Such configurations can be implemented without deviating from the scope of the present disclosure. The use of computer-based systems allows for a great variety of possible configurations, combinations, and divisions of tasks and functionality between and among components. Computer-implemented operations can be performed on a single component or across multiple components. Computer-implemented tasks and/or operations can be performed sequentially or in parallel. Data and instructions can be stored in a single memory device or across multiple memory devices.

While the present subject matter has been described in detail with respect to specific example embodiments and methods thereof, it will be appreciated that those skilled in the art, upon attaining an understanding of the foregoing can readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

What is claimed is:

1. A computer-implemented method for simulating aircraft systems, the method comprising:
    obtaining, by a computing system comprising one or more computing devices, agent data indicative of a simulated aircraft;
    obtaining, by the computing system, world data indicative of a simulated world environment;
    determining, by the computing system, scenario data indicative of a simulation scenario based, at least in part, on the agent data and the world data;
    initializing, by the computing system, a simulation instance for the simulation scenario based, at least in part, on the scenario data,
    wherein the simulation instance comprises the simulated aircraft within the simulated world environment, and
    wherein the simulated aircraft has access to one or more backend services of a transportation services system configured to facilitate an aerial transportation service; and
    simulating, based, at least in part, on the simulation instance, a performance of the simulated aircraft within the simulated world environment, wherein simulating the performance of the simulated aircraft comprises simulating one or more functional API calls for the simulated aircraft to the one or more backend services.

2. The computer-implemented method of claim 1, further comprising:
    obtaining, by the computing system, integration data indicative of the one or more backend services of the transportation services system; and
    determining, by the computing system, an access permission for the simulated aircraft based, at least in part, on the integration data, wherein the simulated aircraft has access to the one or more backend services based, at least in part, on the access permission.

3. The computer-implemented method of claim 2, wherein the one or more backend services comprise one or more permitted services of the transportation services system as indicated by the access permission.

4. The computer-implemented method of claim 1, wherein the simulated aircraft is configured to access the one or more backend services of the transportation services system during the simulation instance via an application programming interface platform.

5. The computer-implemented method of claim 1, further comprising:
    obtaining, by the computing system, at least one timing parameter indicative of a simulation frequency for the simulation scenario, wherein the simulated world environment and the transportation services system are configured to iterate through one or more time steps defined by the simulation frequency.

6. The computer-implemented method of claim 5, wherein the simulation frequency is indicative of real time, and wherein the one or more time steps comprise a time step for each second of real time.

7. The computer-implemented method of claim 5, wherein the simulation frequency is indicative of an accelerated time, and wherein the one or more time steps comprise at least two time steps for each second of real time.

8. The computer-implemented method of claim 5, further comprising:
    obtaining, by the computing system, at least one evaluation parameter indicative of one or more testing metrics;
    determining, by the computing system, evaluation data associated with the simulation instance for at least one of the one or more time steps based, at least in part, on the one or more testing metrics; and
    storing, by the computing system, the evaluation data.

9. The computer-implemented method of claim 5, wherein the world data comprises a plurality of environment variables for each time step of the one or more time steps.

10. The computer-implemented method of claim 9, wherein the agent data comprises an agent definition for the simulated aircraft, wherein the agent definition comprises:
    a sensor interface configured to determine one or more measured values based, at least in part, on at least one of the plurality of environment variables;
    a communications interface configured to communicate data within the simulated world environment; and
    a behavioral engine that defines one or more dynamic behaviors of the simulated aircraft.

11. The computer-implemented method of claim 10, wherein the one or more dynamic behaviors of the simulated aircraft are defined based, at least in part, on a predicted behavior for an aircraft corresponding to the simulated aircraft.

12. A computing system comprising:
    an agent database comprising agent data indicative of a plurality of simulation agents;
    a world database comprising world data indicative of a plurality of simulated world environments;
    one or more processors; and
    one or more memory resources storing instructions that, when executed by the one or more processors, cause the computing system to:
        obtain, via the agent database, agent data indicative of a simulated aircraft, wherein the simulated aircraft is one of the plurality of simulation agents;
        obtain, via the world database, world data indicative of a simulated world environment of the plurality of simulated world environments;
        determine scenario data indicative of a simulation scenario based, at least in part, on the agent data and the world data; and
        initializing a simulation instance for the simulation scenario based, at least in part, on the scenario data,
            wherein the simulation instance comprises the simulated aircraft within the simulated world environment, and
            wherein the simulated aircraft has access to one or more backend services of a transportation services system configured to facilitate an aerial transportation service; and
        simulating, based on the simulation instance, a performance of the simulated aircraft within the simulated world environment, wherein simulating the performance of the simulated aircraft comprises simulating one or more functional API calls for the simulated aircraft to the one or more backend services.

13. The computing system of claim 12, wherein the plurality of simulation agents comprise a plurality of aircraft agents and a plurality of world agents, wherein the simulated aircraft comprises one of the plurality of aircraft agents.

14. The computing system of claim 13, wherein each of the plurality of simulation agents are predetermined based on real world data.

15. The computing system of claim 13, wherein the agent data is indicative of one or more secondary aircraft agents and one or more of the plurality of world agents; and
   wherein the simulation instance comprises the one or more secondary aircraft agents and the one or more world agents within the simulated world environment, and
   wherein the one or more secondary aircraft agents have access to the one or more backend services of the transportation services system.

16. The computing system of claim 12, further comprising:
   a user interface configured to interact with one or more users of the computing system, wherein the computing system is further configured to:
   obtain, via the user interface, input data comprising one or more scenario parameters, the one or more scenario parameters comprising one or more simulation agent parameters and one or more testing environment parameters;
   obtain, via the agent database, the agent data based, at least in part, on the one or more simulation agent parameters, wherein each of the one or more simulation agent parameters identify at least one simulation agent of the plurality of simulation agents; and
   obtain, via the world database, the world data based, at least in part, on the one or more testing environment parameters, wherein each of the one or more testing environment parameters identify at least one simulated world environment of the plurality of simulated world environments.

17. The computing system of claim 16, wherein each of the plurality of simulation agents and the plurality of simulated world environments comprise a corresponding unique identifier, wherein the one or more simulation agent parameters comprise a respective unique identifier for the at least one simulation agent, and wherein the one or more testing environment parameters comprise another respective unique identifier for the at least one simulated world environment.

18. The computing system of claim 16, further configured to:
   simulate, based on the simulation instance, the performance of the simulated aircraft within the simulated world environment by running the simulation instance over one or more time steps;
   determine evaluation data for at least one of the one or more time steps based, at least in part, on the simulation instance; and
   output, via the user interface, the evaluation data to the one or more users of the computing system.

19. A computing system comprising:
   one or more processors; and
   one or more memory resources storing instructions that, when executed by the one or more processors, cause the computing system to:
   obtain agent data indicative of a simulated aircraft;
   obtain world data indicative of a simulated world environment;
   determine scenario data indicative of a simulation scenario based, at least in part, on the agent data and the world data;
   initialize a first simulation instance for the simulation scenario based, at least in part, on the scenario data and a first start time,
      wherein the first simulation instance comprises the simulated aircraft within the simulated world environment, and
      wherein the simulated aircraft has access to one or more backend services of a transportation services system configured to facilitate an aerial transportation service; and
   simulate, based on the first simulation instance, a performance of the simulated aircraft within the simulated world environment by running the first simulation instance over one or more time steps beginning at the first start time, wherein simulating the performance of the simulated aircraft comprises simulating one or more functional API calls for the simulated aircraft to the one or more backend services.

20. The computing system of claim 19, wherein the computing system is further configured to:
   generate a second simulation instance for the simulation scenario based, at least in part, on the scenario data and a second start time; and
   simulate, based on the second simulation instance, the performance of the simulated aircraft within the simulated world environment by running the second simulation instance over one or more time steps beginning at the second start time.

* * * * *